United States Patent
Toda

(10) Patent No.: US 11,996,427 B2
(45) Date of Patent: May 28, 2024

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Atsushi Toda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 285 days.

(21) Appl. No.: 17/420,435

(22) PCT Filed: Dec. 2, 2019

(86) PCT No.: PCT/JP2019/046942
§ 371 (c)(1),
(2) Date: Jul. 2, 2021

(87) PCT Pub. No.: WO2020/144971
PCT Pub. Date: Jul. 16, 2020

(65) Prior Publication Data
US 2022/0085088 A1  Mar. 17, 2022

(30) Foreign Application Priority Data
Jan. 10, 2019  (JP) ................................. 2019-002953

(51) Int. Cl.
*H01L 27/146* (2006.01)
*G01J 3/28* (2006.01)
(Continued)

(52) U.S. Cl.
CPC ...... *H01L 27/14621* (2013.01); *G01J 3/2823* (2013.01); *G02B 5/008* (2013.01);
(Continued)

(58) Field of Classification Search
CPC ......... H01L 27/14621; H01L 27/14625; H01L 27/14612; H01L 31/0232; G01J 3/2823;
(Continued)

(56) References Cited

U.S. PATENT DOCUMENTS

2008/0055728 A1  3/2008  Tanaka et al.
2008/0170143 A1* 7/2008  Yoshida ............ H01L 27/14645
                                                    348/294
(Continued)

FOREIGN PATENT DOCUMENTS

JP  H06-140609  5/1994
JP  2002-117402  4/2002
(Continued)

OTHER PUBLICATIONS

International Search Report prepared by the Japan Patent Office dated Feb. 5, 2020, for International Application No. PCT/JP2019/046942.

*Primary Examiner* — Albert H Cutler
(74) *Attorney, Agent, or Firm* — Sheridan Ross PC

(57) ABSTRACT

Spectral performance in a wide wavelength range is improved. A solid-state imaging device according to an embodiment includes: a pixel array unit in which a plurality of photoelectric conversion elements (PD) are arranged in a two-dimensional lattice form; a plurality of diffraction gratings provided corresponding one-to-one to light-receiving surfaces of the plurality of photoelectric conversion elements; and pixel circuits configured to generate pixel signals on the basis of charge accumulated in the photoelectric conversion elements, wherein a period of a first diffraction grating positioned at a first imaging height is different from a period of a second diffraction grating positioned at a second imaging height different from the first imaging height.

20 Claims, 42 Drawing Sheets

(51) Int. Cl.
  *G02B 5/00* (2006.01)
  *G02B 5/18* (2006.01)
  *G02B 5/20* (2006.01)
  *H04N 5/33* (2023.01)

(52) U.S. Cl.
  CPC ............... *G02B 5/18* (2013.01); *G02B 5/201* (2013.01); *H04N 5/33* (2013.01); *G01J 2003/2826* (2013.01)

(58) Field of Classification Search
  CPC ....... G01J 2003/2826; G01J 2003/1213; G01J 3/0208; G01J 3/0216; G01J 3/0259; G01J 3/0297; G01J 3/12; G02B 5/008; G02B 5/18; G02B 5/201; G02B 5/1866; G02B 5/204; H04N 5/33

See application file for complete search history.

(56) References Cited

U.S. PATENT DOCUMENTS

| | | | |
|---|---|---|---|
| 2012/0057055 A1* | 3/2012 | Yokogawa | H01L 27/14621 348/E9.002 |
| 2012/0292521 A1* | 11/2012 | Yokogawa | H04N 25/702 250/372 |
| 2014/0146207 A1 | 5/2014 | Yokogawa | |
| 2018/0166488 A1 | 6/2018 | Sugizaki | |
| 2018/0205858 A1* | 7/2018 | Tsuruoka | H04N 23/57 |
| 2019/0196183 A1 | 6/2019 | Yokogawa | |
| 2019/0293848 A1 | 9/2019 | Morimitsu | |
| 2020/0401682 A1* | 12/2020 | Lee | G06V 40/166 |

FOREIGN PATENT DOCUMENTS

| | | |
|---|---|---|
| JP | 2008-177191 | 7/2008 |
| JP | 2010-170085 | 8/2010 |
| JP | 2013-030626 | 2/2013 |
| JP | 2017-011002 | 1/2017 |
| JP | 2018-098345 | 6/2018 |
| WO | WO 2005/109042 | 11/2005 |
| WO | WO 2018/030213 | 2/2018 |

* cited by examiner

SOLID-STATE IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2019/046942 having an international filing date of 2 Dec. 2019, which designated the United States, which PCT application claimed the benefit of Japanese Patent Application No. 2019-002953 filed 10 Jan. 2019, the entire disclosures of each of which are incorporated herein by reference.

TECHNICAL FIELD

The present disclosure relates to a solid-state imaging device and an electronic apparatus.

BACKGROUND ART

Recently, a color filter using collective oscillation (surface plasmon resonance) of free electrons which occurs on the surface of a nanoscale metal structure has been developed. In an image sensor employing a color filter using this surface plasmon resonance, a peak wavelength of a spectroscopic spectrum shifts to a longer wavelength because a chief ray is obliquely incident in a region with a high imaging height. As a method for solving this problem, for example, a method of reducing an amount by which a peak wavelength is shifted by decreasing an optical distance between metal structures constituting a plasmon resonance filter has been conceived (refer to PTL 1).

CITATION LIST

Patent Literature

[PTL 1]
JP 2010-170085 A

SUMMARY

Technical Problem

However, the method of reducing the optical distance between metal structures cannot be said to be effective in a region with a long wavelength although it can decrease an amount by which a peak wavelength is shifted in a range with a short wavelength. Accordingly, a problem that errors may be generated in a spectrum in an image surface with a high imaging height occurs in a spectrum in a region with a long wavelength, multiple spectra with a wide wavelength range, and the like.

Accordingly, the present disclosure proposes a solid-state imaging device and an electronic apparatus capable of improving spectroscopic performance in a wide wavelength range.

Solution to Problem

To solve the aforementioned problem, a solid-state imaging device of one aspect according to the present disclosure includes: a pixel array unit in which a plurality of photoelectric conversion elements are arranged in a two-dimensional lattice form; a plurality of diffraction gratings provided in one-to-one corresponding to light-receiving surfaces of the plurality of photoelectric conversion elements; and a pixel circuit configured to generate a pixel signal on the basis of charge accumulated in each of the photoelectric conversion elements, wherein a period of a first diffraction grating positioned at a first imaging height is different from a period of a second diffraction grating positioned at a second imaging height different from the first imaging height.

DESCRIPTION OF EMBODIMENTS

Figure 1:
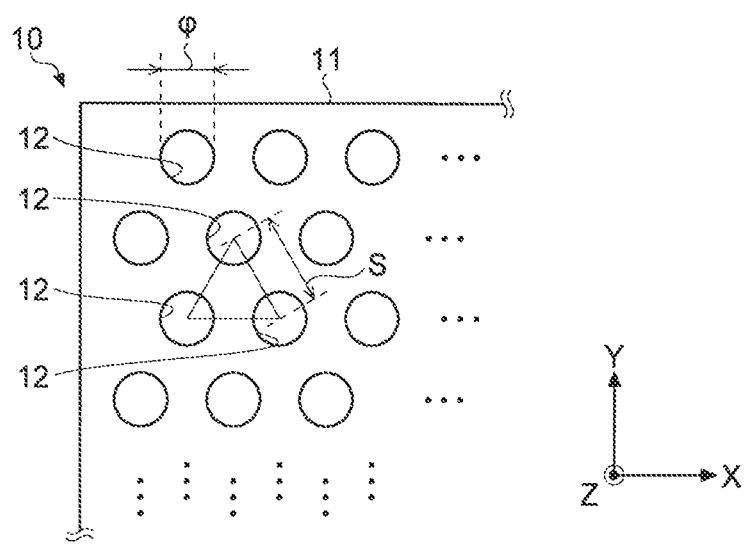
FIG. 1 is a plan view showing an example of a schematic configuration of a surface plasmon resonance filter according to an embodiment.

Hereinafter, an embodiment of the present disclosure will be described in detail on the basis of the drawing. Meanwhile, the same parts are denoted by the same signs and redundant description thereof is omitted in the following description.

In addition, items of the present disclosure will be described in the following order.

Figure 2:
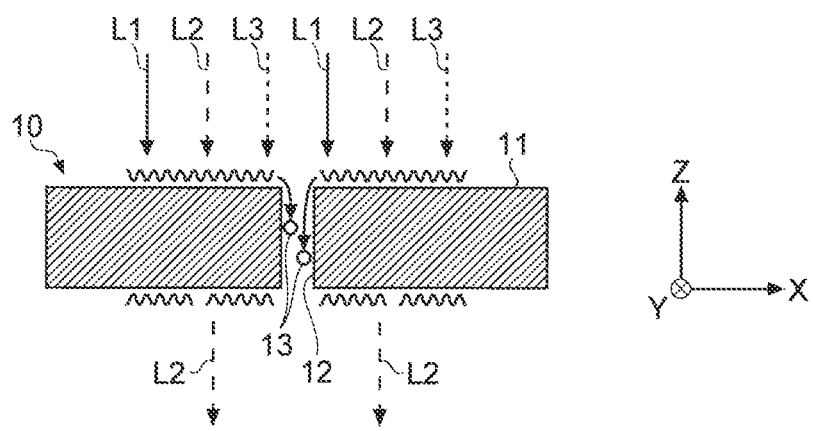
FIG. 2 is a diagram for describing the principle of a propagation type surface plasmon resonance filter.

1. Introduction
2. First Embodiment
2.1 Example of configuration of electronic apparatus
2.2 Example of configuration of solid-state imaging device
2.3 Example of configuration of unit pixel
2.4 Example of basic function of unit pixel
2.5 Example of laminated structure of solid-state imaging device
2.6 Example of cross-sectional structure of unit pixel
2.7 Surface plasmon resonance filter
2.8 Arrangement pattern
2.9 Pupil correction
2.10 Surface plasmon resonance filter with pupil correction
2.11 Simulation results
2.12 Operation and effects
3. Second Embodiment
4. Third Embodiment
4.1 Modified example 1
4.2 Modified example 2
5. Fourth Embodiment
5.1 Localized surface plasmon resonance filter
5.2 Pupil correction
5.3 Localized surface plasmon resonance filter with pupil correction
5.4 Operation and effects
6. Fifth Embodiment
7. Sixth Embodiment 1. Introduction In description of embodiments according to the present disclosure, the principle of a wavelength selective filter using surface plasmon resonance will be described first. FIG. 1 is a plan view showing an example of a schematic configuration of a propagation type wavelength selective filter using surface plasmon resonance (hereinafter referred to as a surface plasmon resonance filter) used in the embodiments below. FIG. 2 is a diagram for describing the principle of the propagation type surface plasmon resonance filter.

As shown in FIG. 1, the surface plasmon resonance filter 10 has a configuration in which a plurality of holes 12 are periodically provided in a metal film 11. The plurality of holes 12 serve as a diffraction grating, and spectral characteristics thereof can be controlled by controlling a period S of the holes 12 and/or a hole diameter φ.

In the surface plasmon resonance filter 10 having this structure, light incident on the surface of the metal film 11 is converted into surface plasmons and resonates on the surface (incident surface) of the metal film 11, as shown in FIG. 2. Components that satisfy structural conditions and property conditions among the resonating surface plasmons pass through the holes 12 to reach the back surface of the metal film 11. For example, in the example shown in FIG. 2, when it is assumed that light L1 is red light, light L2 is green light, L3 is blue light, and the structural conditions and the property conditions of the surface plasmon resonance filter 10 are designed to pass the green light L2, surface plasmons 13 of components corresponding to the green light L2 among the surface plasmons resonating on the surface of the metal film 11 pass through the holes 12 to reach the back surface of the metal film 11. Here, a component with a lower frequency than a cutoff frequency of a waveguide formed by the holes 12, that is, a component with a long wavelength can also pass through the holes 12.

The surface plasmons 13 that reach the back surface of the metal film 11 are converted into the light L2 again on the back surface and projected. Meanwhile, although an example in which light is split according to the propagation type surface plasmon has been described here, it is also possible to split light according to the same principle in a localized surface plasmon resonance filter having a structure in which nanoscale metallic columnar structures (hereinafter referred to as metal nanostructures) are periodically arranged (hereinafter referred to as a localized surface plasmon resonance filter).

In splitting of light using the surface plasmon resonance described above, spectral characteristics change for obliquely incident light. For example, a phenomenon in which a peak wavelength in a spectroscopic spectrum of a surface plasmon resonance filter shifts to a longer wavelength for light obliquely incident an image surface may occur.

Figure 3:
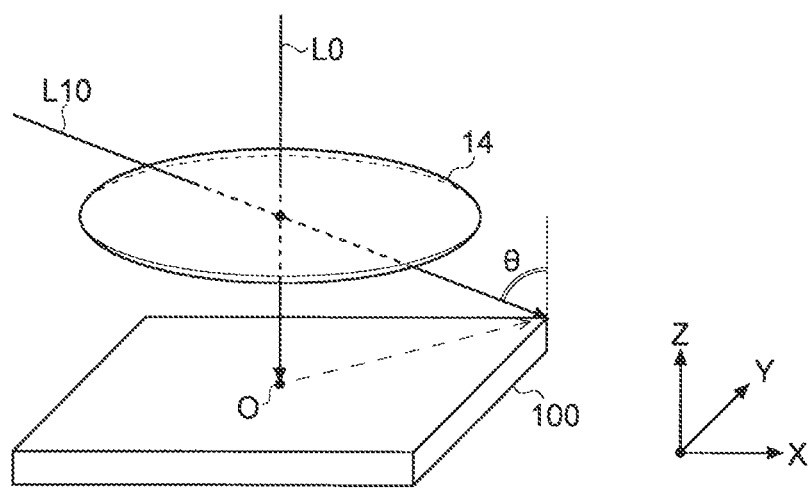
FIG. 3 is a diagram for describing an inclination angle of light incident on an image sensor.
Figure 4:
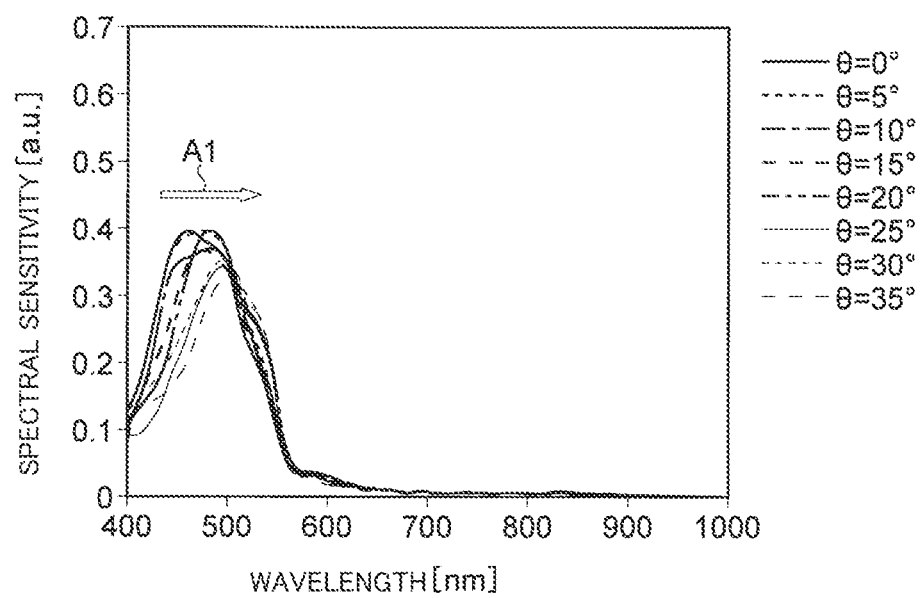
FIG. 4 is a diagram showing shifting of a peak wavelength of a surface plasmon resonance filter according to an imaging height.

This will be described using examples shown in FIG. 3 and FIG. 4. As illustrated in FIG. 3, as an imaging height increases, in other words, an inclination of light perpendicularly incident on the center O of a light-receiving surface of a solid-state imaging device 100 with respect to a chief ray L0 increases, an angle (chief ray angle (CRA) θ of incidence of a chief ray L10 of this light on the light-receiving surface of the solid-state imaging device 100 through a lens 14 increases. Then, a peak wavelength of a spectroscopic spectrum shifts in a direction of an arrow A1 in response to the magnitude of the angle of incidence θ, as illustrated in FIG. 4.

When such shifting of the peak wavelength occurs, the accuracy of information acquired by the solid-state imaging device 100 deteriorates. This leads to a problem of increasing a likelihood of occurrence of a wrong determination, for example, in evaluation of vegetation states agricultural applications and biometric detection of the human skin and the like in biometric recognition applications.

Accordingly, in the following embodiments, specific examples of a configuration and a method for reducing shifting of a peak wavelength of a spectroscopic spectrum to a longer wavelength which occurs in a region with a high imaging height according to pupil correction will be described.

2. First Embodiment

First, a solid-state imaging device and an electronic apparatus according to a first embodiment will be described in detail with reference to the drawings.

2.1 Example of Configuration of Electronic Apparatus

Figure 5:
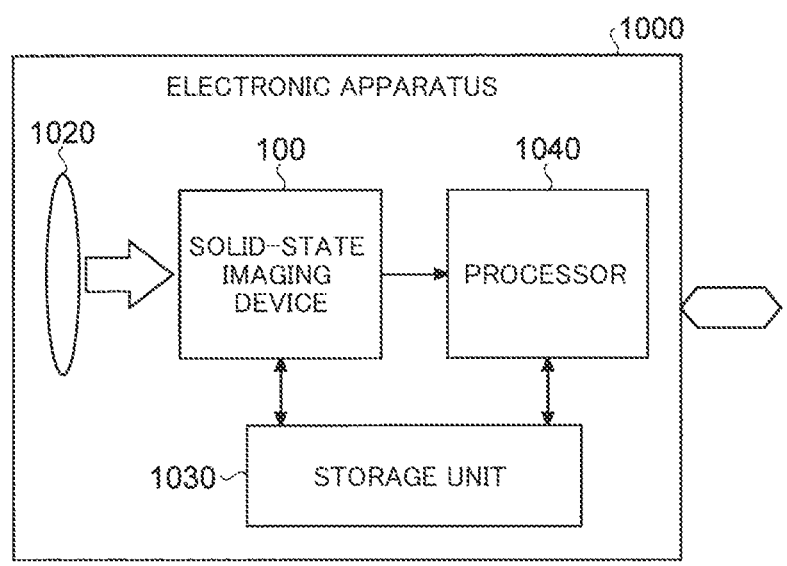
FIG. 5 is a block diagram showing an example of a schematic configuration of an electronic apparatus equipped with an image sensor according to a first embodiment.

FIG. 5 is a block diagram showing an example of a schematic configuration of an electronic apparatus equipped with a solid-state imaging device according to the first embodiment. As shown in FIG. 5, the electronic apparatus 1000 includes, for example, an imaging lens 1020, a solid-state imaging device 100, a storage unit 1030, and a processor 1040.

The imaging lens 1020 is an example of an optical system that concentrates incident light and forms the concentrated light as an image on a light-receiving surface of the solid-state imaging device 100. The light-receiving surface may be a surface on which photoelectric conversion elements are arranged in the solid-state imaging device 100. The solid-state imaging device 100 photoelectrically converts incident light to generate image data. In addition, the solid-state imaging device 100 executes predetermined signal processing such as noise removal and white balance adjustment on the generated image data.

The storage unit 1030 includes, for example, a flash memory, a dynamic random access memory (DRAM), a static random access memory (SRAM), and the like and records image data and the like input from the solid-state imaging device 100.

The processor 1040 is configured, for example, using a central processing unit (CPU) or the like and may include an application processor that executes an operating system, various types of application software and the like, a graphics processing unit (GPU), a baseband processor, and the like. The processor 1040 executes various types of processing on image data input from the solid-state imaging device 100, image data read from the storage unit 1030, and the like, displays the image data and the like to a user, or transmits the image data and the like to the outside through a predetermined network as necessary.

2.2 Example of Configuration of Solid-State Imaging Device

Figure 6:
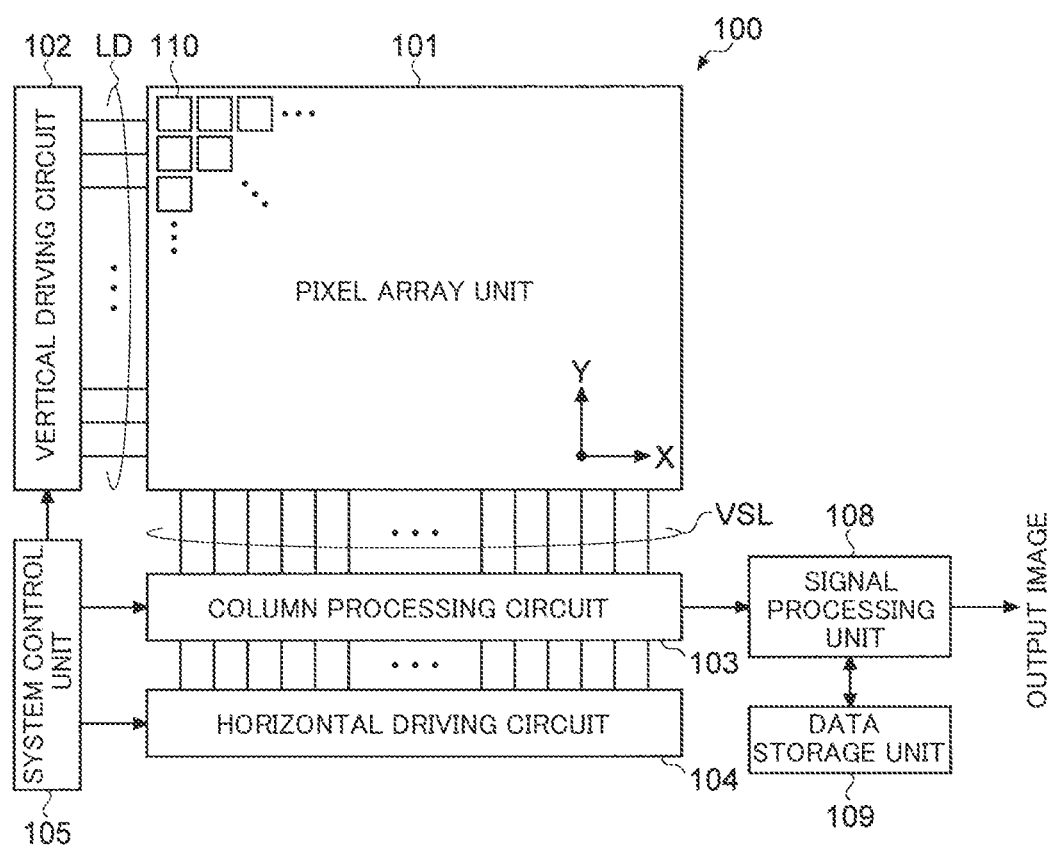
FIG. 6 is a block diagram showing an example of a schematic configuration of the image sensor according to the first embodiment.

FIG. 6 is a block diagram showing an example of a schematic configuration of a complementary metal-oxide-semiconductor (CMOS) type solid-state imaging device (hereinafter simply referred to as an image sensor) according to the first embodiment. Here, the CMOS type image sensor is an image sensor created by applying a CMOS process or partially using a CMOS process. For example, the image sensor 100 according to the present embodiment may be configured as a back surface radiation type image sensor.

The image sensor 100 according to the present embodiment has, for example, a stack structure in which a semiconductor chip on which a pixel array unit 101 is formed and a semiconductor chip on which peripheral circuits are formed are stacked on each other. The peripheral circuits may include, for example, a vertical driving circuit 102, a column processing circuit 103, a horizontal driving circuit 104, and a system control unit 105.

The image sensor 100 further includes a signal processing unit 108 and a data storage unit 109. The signal processing unit 108 and the data storage unit 109 may be provided on the same semiconductor chip as that having the peripheral circuits provided thereon or provided on a separate semiconductor chip.

The pixel array unit 101 has a configuration in which unit pixels (which may be simply described as "pixels" hereinafter) 110 including photoelectric conversion elements that generate and accumulate charge in response to the amount of received light are arranged in a row direction and a column direction, that is, in a two-dimensional lattice form in a matrix form. Here, the row direction is an arrangement direction (a horizontal direction in the figure) of pixels in pixel rows, and the column direction is an arrangement direction (a vertical direction in the figure) of pixels in pixel columns. Details of a specific circuit configuration and a pixel structure of the unit pixels will be described later.

In the pixel array unit 101, a pixel drive line LD is wired in the row direction for each pixel row and a vertical signal line VSL is wired in the column direction for each pixel column for the pixel arrangement in the matrix form. The pixel drive line LD transmits a driving signal for performing driving when a signal is read from a pixel. Although the pixel drive lines LD are illustrated as individual wires in FIG. 6, they are not limited thereto. One end of each pixel drive line LD is connected to an output terminal of the vertical driving circuit 102 corresponding to each row.

The vertical driving circuit 102 includes a shift register, an address decoder, and the like, and drives each pixel of the pixel array unit 101 simultaneously for all pixels or for each row. That is, the vertical driving circuit 102 constitutes a driving unit that controls the operation of each pixel of the pixel array unit 101 along with the system control unit 105 that controls the vertical driving circuit 102. Although illustration of a specific configuration of the vertical driving circuit 102 is omitted, it generally includes two scanning systems, a read scanning system and a sweep scanning system.

The read scanning system sequentially selects and scans the unit pixels of the pixel array unit 101 for each row in order to read out signals from the unit pixels. The signals read from the unit pixels are analog signals. The sweep scanning system performs sweep scanning on read rows on which read scanning is performed by the read scanning system an exposure time in advance of the read scanning.

Unnecessary charge is swept from photoelectric conversion elements of unit pixels of the read rows through sweep scanning of the sweep scanning system, and thus the photoelectric conversion elements are reset. Then, the sweep scanning system sweeps (resets) the unnecessary charge so that a so-called electronic shutter operation is performed. Here, the electronic shutter operation is an operation of discarding charges of the photoelectric conversion elements and newly starting exposure (starting accumulation of charges).

A signal read by a read operation of the read scanning system corresponds to an amount of light received after an immediately previous read operation or an electronic shutter operation. In addition, a period from a read timing in the immediately previous read operation or a sweep timing in the electronic shutter operation to a read timing in a current read operation is a charge accumulation period (also referred to as an exposure period) in the unit pixel.

A signal output from each unit pixel in a pixel row selectively scanned by the vertical driving circuit 102 is input to the column processing circuit 103 through each vertical signal line VSL for each pixel column. The column processing circuit 103 performs, for each pixel column of the pixel array unit 101, predetermined signal processing on a signal output from each unit pixel in a selected row through the vertical signal line VSL and temporarily holds the pixel signal after the signal processing.

Specifically, the column processing circuit 103 performs, as the signal processing, at least noise removal processing, for example, correlated double sampling (CDS) processing and double data sampling (DDS) processing. For example, reset noise and pixel-specific fixed pattern noise such as a variation in a threshold value of amplification transistors in pixels are removed through CDS processing. The column processing circuit 103 includes, for example, an analog-digital (AD) conversion function, converts an analog pixel signal read and obtained from a photoelectric conversion element into a digital signal, and outputs the digital signal.

The horizontal driving circuit 104 includes a shift register, an address decoder, and the like and sequentially selects read circuits (hereinafter referred to as pixel circuits) corresponding to the pixel columns of the column processing circuit 103. By this selective scanning performed by the horizontal driving circuit 104, pixel signals processed by the column processing circuit 103 for each pixel circuit are sequentially output.

The system control unit 105 includes a timing generator for generating various timing signals, and the like and performs drive control of the vertical driving circuit 102, the column processing circuit 103, the horizontal driving circuit 104, and the like on the basis of various timings generated by the timing generator.

The signal processing unit 108 has at least an arithmetic operation processing function and performs various types of signal processing such as arithmetic operation processing on the pixel signals output from the column processing circuit 103. The data storage unit 109 temporarily stores data necessary for the signal processing in the signal processing unit 108.

Further, image data output from the signal processing unit 108 may, for example, undergo predetermined processing executed in the processor 1040 of the electronic apparatus 1000 equipped with the image sensor 100 and the like or may be transmitted to the outside through a predetermined network.

2.3 Example of Configuration of Unit Pixel

Figure 7:
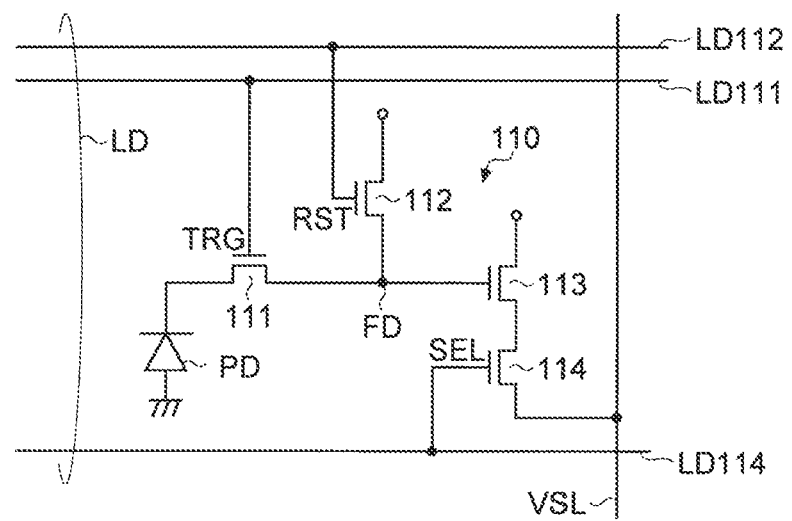
FIG. 7 is a circuit diagram showing an example of a schematic configuration of a unit pixel according to the first embodiment.

FIG. 7 is a circuit diagram showing an example of a schematic configuration of the unit pixel according to the present embodiment.

As shown in FIG. 7, the unit pixel 110 includes a photodiode PD, a transfer transistor 111, a reset transistor 112, an amplification transistor 113, a select transistor 114, and a floating diffusion layer FD.

A select transistor drive line LD114 included in the pixel drive lines LD is connected to the gate of the select transistor 114, a reset transistor drive line LD112 included in the pixel drive lines LD is connected to the gate of the reset transistor 112, and a transfer transistor drive line LD111 included in the pixel drive lines LD is connected to the gate of the transfer transistor 111. In addition, the vertical signal line VSL connected to the column processing circuit 103 through one end thereof is connected to the drain of the amplification transistor 113 through the select transistor 114.

In the following description, the reset transistor 112, the amplification transistor 113, and the select transistor 114 are also collectively called a pixel circuit. This pixel circuit may include the floating diffusion layer FD and/or the transfer transistor 111.

The photodiode PD performs photoelectric conversion of incident light. The transfer transistor 111 transfers charge generated in the photodiode PD. The floating diffusion layer FD accumulates the charge transferred from the transfer transistor 111. The amplification transistor 113 causes a pixel signal having a voltage value corresponding to the charge accumulated in the floating diffusion layer FD to appear on the vertical signal line VSL. The reset transistor 112 discharges the charge accumulated in the floating diffusion layer FD. The select transistor 114 selects the unit pixel 110 that is a read target.

The anode of the photodiode PD is grounded and the cathode thereof is connected to the source of the transfer transistor 111. The drain of the transfer transistor 111 is connected to the source of the reset transistor 112 and the gate of the amplification transistor 113, and a node that is a connection point thereof constitutes the floating diffusion layer FD. Further, the drain of the reset transistor 112 is connected to a vertical reset input line that is not illustrated.

The source of the amplification transistor 113 is connected to a vertical current supply line that is not illustrated. The drain of the amplification transistor 113 is connected to the source of the select transistor 114, and the drain of the select transistor 114 is connected to the vertical signal line VSL.

The floating diffusion layer FD converts accumulated charge into a voltage having a voltage value corresponding to the amount of charge. Further, the floating diffusion layer FD may be a ground capacitance, for example. However, the floating diffusion layer FD is not limited thereto and may be a capacitance added by intentionally connecting a capacitor or the like to the node to which the drain of the transfer transistor 111, the source of the reset transistor 112, and the gate of the amplification transistor 113 are connected.

2.4 Example of Basic Function of Unit Pixel

Next, the basic function of the unit pixel 110 will be described with reference to FIG. 7.

The reset transistor 112 controls discharge (reset) of charge accumulated in the floating diffusion layer FD according to a reset signal RST supplied from the vertical driving circuit 102 through the reset transistor drive line LD112. Further, it is also possible to discharge (reset) charge accumulated in the photodiode PD in addition to the charge accumulated in the floating diffusion layer FD by switching the transfer transistor 111 to an on state when the reset transistor 112 is in an on state.

When a reset signal RST at a high level is input to the gate of the reset transistor 112, the floating diffusion layer FD is clamped to a voltage applied through the vertical reset input line. Accordingly, the charge accumulated in the floating diffusion layer FD is discharged (reset).

In addition, when a reset signal RST at a low level is input to the gate of the reset transistor 112, the floating diffusion layer FD is electrically cut off from the vertical reset input line and enters a floating state.

The photodiode PD performs photoelectric conversion of incident light and generates charge corresponding to the amount of light. The generated charge is accumulated on the side of the cathode of the photodiode PD. The transfer transistor 111 controls transfer of charge from the photodiode PD to the floating diffusion layer FD according to a transfer control signal TRG supplied from the vertical driving circuit 102 through the transfer transistor drive line LD111.

For example, when a transfer control signal TRG at a high level is input to the gate of the transfer transistor 111, charge accumulated in the photodiode PD is transferred to the floating diffusion layer FD. On the other hand, when a transfer control signal TRG at a low level is supplied to the gate of the transfer transistor 111, transfer of charge from the photodiode PD stops.

As described above, the floating diffusion layer FD has a function of converting the charge transferred from the photodiode PD through the transfer transistor 111 into a voltage having a voltage value corresponding to the amount of charge. Accordingly, in a floating state in which the reset transistor 112 is turned off, the electric potential of the floating diffusion layer FD is modulated in response to the amount of charge accumulated therein.

The amplification transistor 113 serves as an amplifier having a variation in the electric potential of the floating diffusion layer FD connected to the gate thereof as an input signal, and an output voltage signal of the amplification transistor 113 appears as a pixel signal on the vertical signal line VSL through the select transistor 114.

The select transistor 114 controls appearance of a pixel signal on the vertical signal line VSL according to the amplification transistor 113 in response to the select control signal SEL supplied from the vertical driving circuit 102 through the select transistor drive line LD114. For example, when a select control signal SEL at a high level is input to the gate of the select transistor 114, a pixel signal according to the amplification transistor 113 appears on the vertical signal line VSL. On the other hand, when a select control signal SEL at a low level is input to the gate of the select transistor 114, appearance of the pixel signal on the vertical signal line VSL stops. Accordingly, in the vertical signal line VSL to which a plurality of unit pixels 110 are connected, only the output of a selected unit pixel 110 can be extracted.

2.5 Example of Laminated Structure of Solid-State Imaging Device

Figure 8:
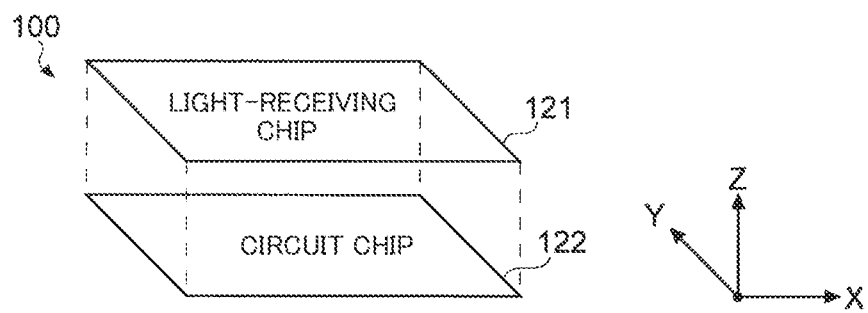
FIG. 8 is a diagram showing an example of a laminated structure of the image sensor according to the first embodiment.

FIG. 8 is a diagram showing an example of a laminated structure of the image sensor according to the present embodiment.

As shown in FIG. 8, the image sensor 100 has a structure in which a light-receiving chip 121 and a circuit chip 122 are vertically laminated. The light-receiving chip 121 is, for example, a semiconductor chip including the pixel array unit 101 in which photodiodes PD are arranged, and the circuit chip 122 is, for example, a semiconductor chip in which the pixel circuit shown in FIG. 7 is disposed.

For bonding of the light-receiving chip 121 and the circuit chip 122, for example, so-called direct bonding of flattening bonding surfaces of the light-receiving chip 121 and the circuit chip 122 and attaching the chips to each other using intermolecular force can be used. However, the bonding method is not limited thereto, and a so-called Cu—Cu bonding method of bonding electrode pads made of copper (Cu) formed on bonding surfaces, bump bonding, and the like may be used, for example.

In addition, the light-receiving chip 121 and the circuit chip 122 are electrically connected, for example, through a connection part such as a through-silicon via (TSV) penetrating the semiconductor substrate. For connection using a TSV, for example, a so-called twin TSV method of connecting two TSVs, a TSV provided in the light-receiving chip 121 and a TSV provided from the light-receiving chip 121 to the circuit chip 122, on the external surfaces of the chips, a so-called shared TSV method of connecting both chips using a TSV penetrating from the light-receiving chip 121 to the circuit chip 122, and the like can be employed.

However, when Cu—Cu bonding or bump bonding is used for bonding of the light-receiving chip 121 and the circuit chip 122, the chips are electrically connected through a Cu—Cu bonding part or a bump bonding part.

2.6 Example of Cross-Sectional Structure of Unit Pixel

Figure 9:
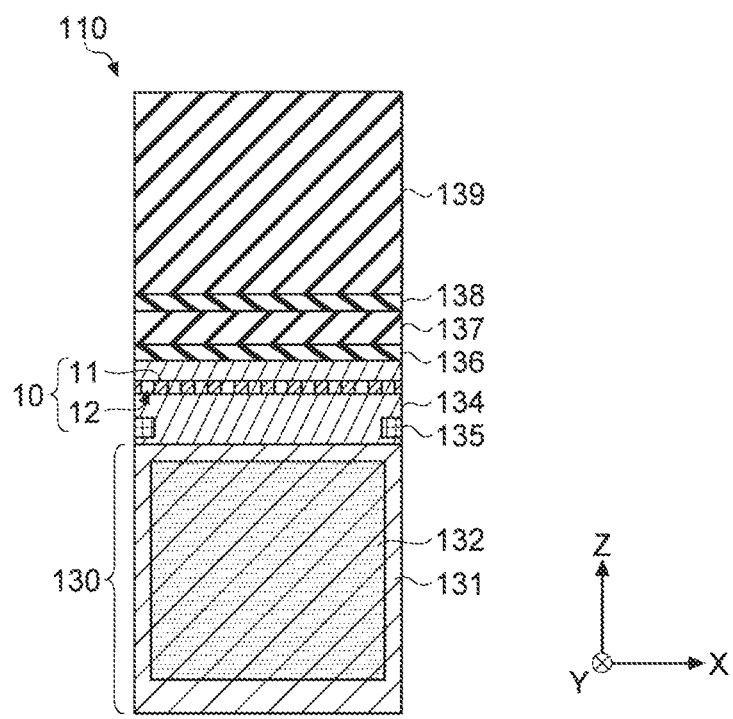
FIG. 9 is a cross-sectional view showing an example of a schematic structure of a unit pixel in the image sensor according to the first embodiment.

FIG. 9 is a cross-sectional view showing an example of a schematic structure of a unit pixel of the image sensor according to the present embodiment.

Meanwhile, in FIG. 9, an example of a cross-sectional structure of the light-receiving chip 121 in FIG. 8 is shown and an example of a cross-sectional structure of the circuit chip 122 is omitted for simplification of description. In addition, in FIG. 9, a wiring layer for electrical connection from the transfer transistor 111 and the light-receiving chip 121 to the circuit chip 122 is also omitted.

As shown in FIG. 9, the unit pixel 110 includes a semiconductor substrate 130, an insulating film 134 provided on the back surface (upper surface in the figure) of the semiconductor substrate 130, an antireflection film 136 provided on the insulating film 134, an antioxidation film 137 provided on the antireflection film 136, an antireflection film 138 provided on the antioxidation film 137, and a passivation film 139 that is a top layer provided on the antireflection film 138.

For example, an insulating material such as silicon oxide (SiO$_2$) can be used for the insulating film 134 and the passivation film 139. For example, a high refractive index material such as silicon oxynitride (SiON) can be used for the antireflection films 136 and 138. For example, a material having a function of curbing the spread of water molecules, such as silicon nitride (SiN) can be used for the antioxidation film 137.

The semiconductor substrate 130 includes, for example, N type semiconductor regions 132 formed by diffusing an N type dopant into rectangular regions arranged in a two-dimensional lattice form on the back surface, and a P type semiconductor region 131 surrounding each N type semiconductor region 132. These N type semiconductor regions 132 and P type semiconductor regions 131 constitute photodiodes PD that are photoelectric conversion elements.

In addition, a light-shielding film 135 for reducing leaking of light obliquely incident on a certain unit pixel 110 into a photodiode PD of another unit pixel (hereinafter referred to as a neighboring pixel) 110 neighboring this unit pixel 110 is provided in the insulating film 134 between unit pixels 110. For example, a light-shielding material such as tungsten (W) can be used for the light-shielding film 135.

Meanwhile, although not illustrated, a pixel isolation part for isolating neighboring photodiodes PDs from each other may be provided between unit pixels 110 in the semiconductor substrate 130. This pixel isolation part may be formed, for example, by embedding an insulating film in a trench formed between neighboring photodiodes PD in the semiconductor substrate 130. Here, a void may remain in the trench.

In addition, the trench in which the pixel isolation part is formed may reach from the back surface to the front surface of the semiconductor substrate 130 or formed from the back surface to the middle of the semiconductor substrate 130. In the following description, a configuration in which the trench reaches from the back surface to the front surface of the semiconductor substrate 130 is referred to as a front full trench isolation (FFTI) type and a configuration in which the trench reaches from the back surface to the middle of the semiconductor substrate 130 is referred to as a reverse deep trench isolation (RDTI) type.

In the above configuration, for example, the surface plasmon resonance filter 10 is provided in the insulating film 134. The position of the surface plasmon resonance filter 10 may be above the light-shielding film 135, for example. However, the position of the surface plasmon resonance filter 10 is not limited thereto and may be changed to various positions at which light incident on the photodiodes PD can be split while diffusion of atoms constituting the surface plasmon resonance filter 10 to the semiconductor substrate 130 is curbed.

2.7 Surface Plasmon Resonance Filter

Figure 10:
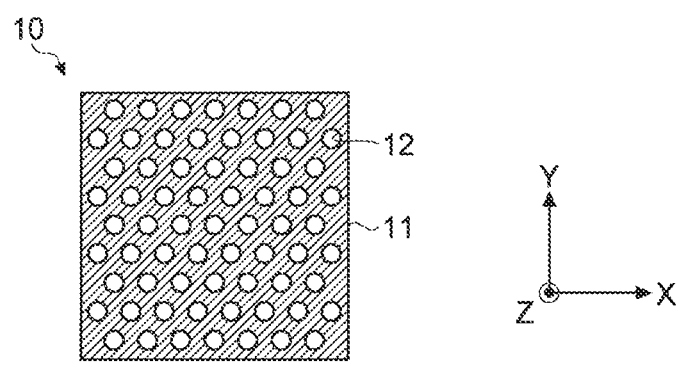
FIG. 10 is a top view showing an example of a schematic configuration of a surface plasmon resonance filter according to the first embodiment.

FIG. 10 is a top view showing an example of a schematic configuration of the surface plasmon resonance filter according to the present embodiment. Further, FIG. 10 shows the surface plasmon resonance filter 10 provided for a single unit pixel 110.

As shown in FIG. 10, the surface plasmon resonance filter 10 has, for example, a configuration in which the plurality of holes 12 are periodically provided in the metal film 11, as described using FIG. 1 and the like.

For example, Al (aluminum)-Cu (copper) and the like can be used for the metal film 11. However, the material of the metal film 11 is not limited thereto, and various metal materials capable of causing surface plasmon resonance to occur, such as aluminum (Al), an aluminum alloy, gold (Au), and silver (Ag), can be used. A film thickness of the metal film 11 can be 150 nm, for example.

For example, a dielectric may be buried in the inside of each hole 12. The same insulating material as the insulating film 134 can be used for this dielectric. It is possible to facilitate a manufacturing process of the insulating film 134 and the surface plasmon resonance filter 10 by using the same insulating material as the insulating film 134 as a material buried in the holes 12.

Further, the opening shape of the hole 12 is not limited to a circle and may be modified into various shapes such as an ellipse, regular polygons such as a square and a regular hexagon, a rectangle, and a rhomboid.

In addition, the arrangement of the holes 12 is not limited to the arrangement having a rhomboid arrangement as a unit cell (also referred to as a hexagonal dense arrangement), as illustrated in FIG. 10, and can be modified into various configurations in which the holes 12 are periodically arranged at equal intervals, such as a square arrangement in which the holes 12 are arranged in row and column directions.

2.8 Arrangement Pattern

The surface plasmon resonance filter 10 having the configuration described above can control spectral characteristics by controlling the period S and/or the hole diameter φ of the holes 12 serving as a diffraction grating, as described above (refer to FIG. 1 and FIG. 2, for example). Accordingly, in the present embodiment, color filters that selectively transmit specific wavelength components such as a red (R) wavelength component, a green (G) wavelength component, a blue (B) wavelength component, and a wavelength component of infrared rays (IR) by adjusting the period S and/or the hole diameter φ of the holes 12 are configured.

Figure 11:
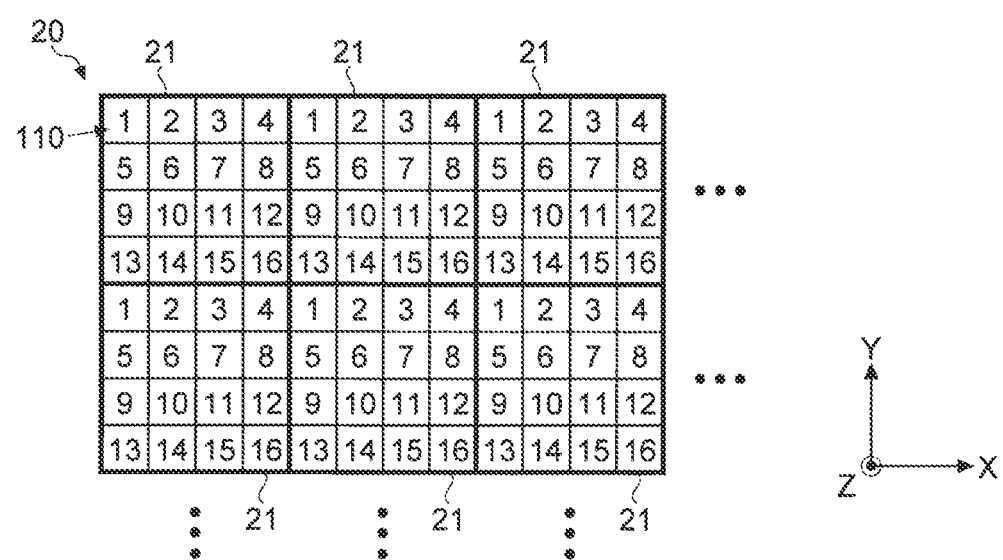
FIG. 11 is a plan layout diagram showing an example of arrangement of the surface plasmon resonance filters according to the first embodiment.

FIG. 11 is a plan layout diagram showing an example of arrangement of surface plasmon resonance filters according to the present embodiment. Further, FIG. 11 shows an example of arrangement of the surface plasmon resonance filters 10 when the pixel array unit 101 (refer to FIG. 6) is viewed in an incident direction of light. In addition, FIG. 11 illustrates a case in which 16 kinds of color filters (#1 to #16 in FIG. 11) having different spectral characteristics, in other words, having different selectively transmitting wavelength components are configured as the surface plasmon resonance filters 10 by adjusting the period S and/or the hole diameter φ of the holes 12.

As illustrated in FIG. 11, a color filter arrangement 20 in a case where color filters are configured as the 16 kinds of surface plasmon resonance filters 10 having different spectral characteristics includes, for example, an arrangement in which the 16 surface plasmon resonant color filters 10 respectively including the 16 kinds of color filters are arranged in 4 rows and 4 columns and this 4-row 4-column arrangement pattern is used as a repeated unit pattern 21.

However, the arrangement of the surface plasmon resonance filters is not limited to the configuration illustrated in FIG. 11, and a configuration in which all surface plasmon resonance filters 10 selectively transmit the same wavelength component or a configuration in which surface plasmon resonance filters 10 selectively transmit two or more different wavelength components may be employed.

In addition, the unit pattern 21 is not limited to 4 rows and 4 columns and may be arranged in n rows and n columns (n is a positive integer), such as 5 rows and 5 columns and 6 rows and 6 columns, and arranged in m rows and n columns (m is a positive integer).

By providing the plurality of kinds of surface plasmon resonance filters 10 having different spectral characteristics in this manner, image data of multi-spectrum (also called a hyper spectrum) can be acquired. Accordingly, it is possible to realize the image sensor 100 applicable to various applications such as agriculture and biometric detection.

However, the present disclosure is not limited to the multi-spectrum and, for example, a generally used color filter arrangement, such as Bayer arrangement and quad Bayer arrangement, may also be realized using the surface plasmon resonance filters 10.

2.9. Pupil Correction

Next, pupil correction according to the present embodiment will be described. In the present embodiment, the feature of the surface plasmon resonance filter 10 capable of controlling spectral characteristics by controlling the period S and/or the hole diameter φ of the holes 12 is applied to pupil correction. That is, in the present embodiment, shifting of a peak wavelength of a spectroscopic spectrum to a longer wavelength which occurs in a region with a high imaging height is reduced according to pupil correction by controlling the period S and/or the hole diameter φ of the holes 12.

Figure 12:
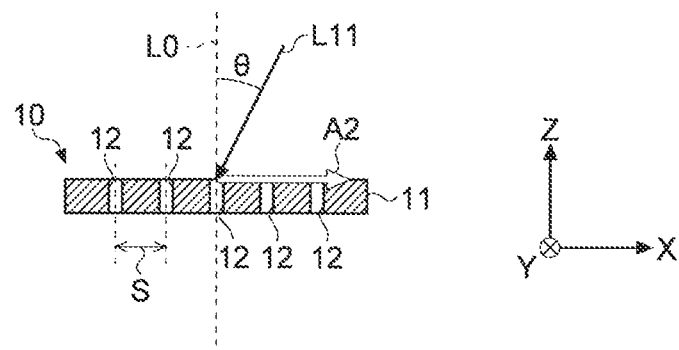
FIG. 12 is a cross-sectional view showing a schematic configuration of the surface plasmon resonance filter according to the first embodiment.
Figure 13:
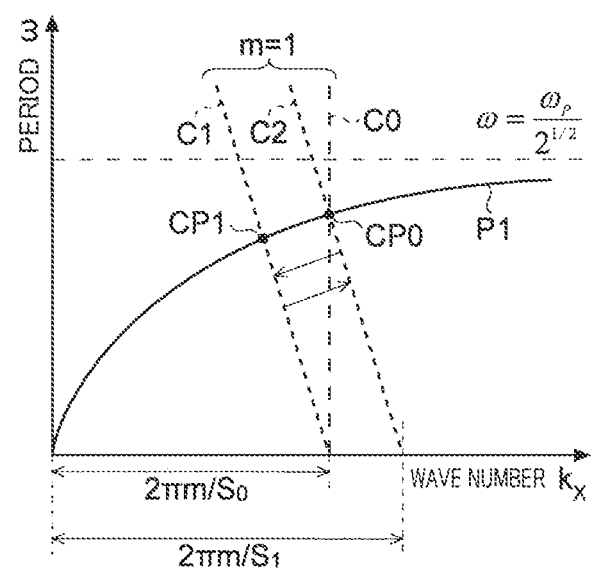
FIG. 13 is a diagram for describing pupil correction according to the first embodiment.

FIG. 12 and FIG. 13 are diagrams for describing pupil correction according to the first embodiment, FIG. 12 is a cross-sectional view showing a schematic configuration of the surface plasmon resonance filter, and FIG. 13 is a diagram for describing pupil correction according to the present embodiment.

The surface plasmon resonance filter 10 illustrated in FIG. 12 includes a diffraction grating according to a plurality of holes 12 arranged in a predetermined period S. A structural condition for a wave number $K_{SP}$ of surface plasmon generated in the surface plasmon resonance filter 10 in this structure can be represented by formula (1) below from a component $k_0 \sin \theta$ of a wave number $k_0$ of incident light L11 in a direction of an arrow A2 (X direction) and a wave number 2 nm/S of the diffraction grating. In formula (1), the wave number $k_0$ and an angle of incidence θ are the wave number and the angle of incidence of the incident light L11. In addition, m is an order, and S is a period of the diffraction grating composed of the holes 12.

[Math. 1]
$$k_{SP} = -k_0 \sin\theta + 2\pi \frac{m}{S} \tag{1}$$

In addition, a physical condition for the wave number $k_{SP}$ of the surface plasmon determined by the constituent material of the metal film 11 and a medium surrounding the metal film 11 can be represented by formula (2) below. In formula (2), c is the velocity of light, ω is a frequency, ε1 is a dielectric constant of the metal, and ε2 is a dielectric constant of the surrounding medium.

[Math. 2]
$$k_{SP} = \left(\frac{\omega}{c}\right)\left(\frac{\varepsilon_1 \varepsilon_2}{\varepsilon_1 + \varepsilon_2}\right)^{\frac{1}{2}} \tag{2}$$

Accordingly, to satisfy resonance conditions of the surface plasmon, it is necessary to satisfy both formula (1) and formula (2).

Here, in a case where the incident light L11 is obliquely incident at the angle θ, the wave number component $K_0 \sin \theta$ of the left term in formula (1) is reduced as compared to a case in which light is incident perpendicularly (θ=0°). Accordingly, a peak wavelength in the spectroscopic spectrum shifts to a longer wavelength.

This is described using FIG. 13. In FIG. 13, a straight line C0 represents a structural condition in a case where light is incident perpendicularly (θ=0°), a straight line C1 represents a case where light is obliquely incident at an angle of incidence θ (without pupil correction), and a straight line C2 represents a case where light is obliquely incident at an angle of incidence θ (with pupil correction). In addition, in FIG. 13, a period of the holes 12 without pupil correction is $S_0$ and a period of the holes 12 with pupil correction is $S_1$.

As shown in FIG. 13, in the case where the incident light L11 is obliquely incident at the angle θ (structural condition C1), the wave number component $K_0 \sin \theta$ of the left term in formula (1) is reduced and thus an intersection point CP1 of the structural condition C1 and a physical condition P1 shifts to a lower frequency side than an intersection point CP0, as compared to the case where light is incident perpendicularly (θ=0°) (structural condition C0). This represents that a peak wavelength in a spectroscopic spectrum has shifted to a longer wavelength side.

Accordingly, in the present embodiment, the period S of the holes 12 is changed from the period $S_0$ to the period $S_1$ such that the structural condition in a case where the incident light L11 is obliquely incident at the angle θ becomes a structural condition C2 intersecting the physical condition P1 at the intersection point CP0. Specifically, a period after pupil correction (hereinafter referred to as corrected period) $S_1$ is assumed to be a value obtained by formula (3) below.

[Math. 3]

$$S_1 = \left(\frac{1}{1+\sin\theta}\right) \times S_0 \quad (3)$$

However, the corrected period $S_1$ may also be approximately obtained using formula (4) below instead of formula (3).

[Math. 4]

$$S_1 = \cos\theta \times S_0 \quad (4)$$

As described above, it is possible to curb shifting of a peak wavelength in a spectroscopic spectrum to a longer wavelength because the physical condition is shifted by correcting the period S of the holes 12.

Meanwhile, in FIG. 13, the physical condition P1 approximates formula (5) below.

[Math. 5]

$$\omega = \frac{\omega_P}{2^{1/2}} \quad (5)$$

Further, in formula (5), $\omega_P$ is a plasma frequency and is an angular frequency $\omega_P$ determined from the dielectric constant $\varepsilon_0$ of the vacuum according to formula (6) below.

[Math. 6]

$$\omega_P = \left(\frac{ne}{\varepsilon_0 \times m}\right)^{\frac{1}{2}} \quad (6)$$

2.10 Surface Plasmon Resonance Filter with Pupil Correction

Subsequently, an example of a structure of a surface plasmon resonance filter 10 with pupil correction will be described below.

Figure 14:
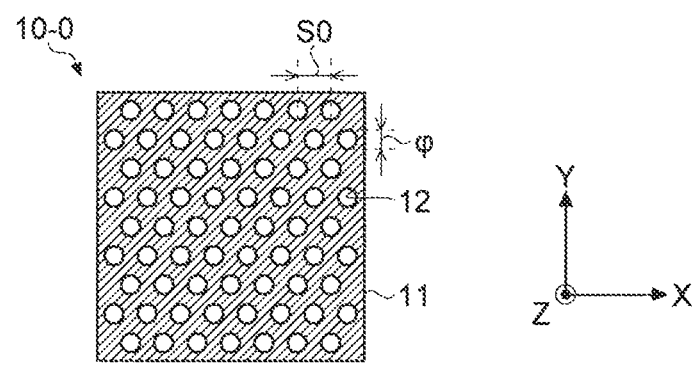
FIG. 14 is a top view showing an example of a schematic configuration of a surface plasmon resonance filter included in a unit pixel positioned in a region where an angle of incidence θ is 0 according to the first embodiment.
Figure 15:
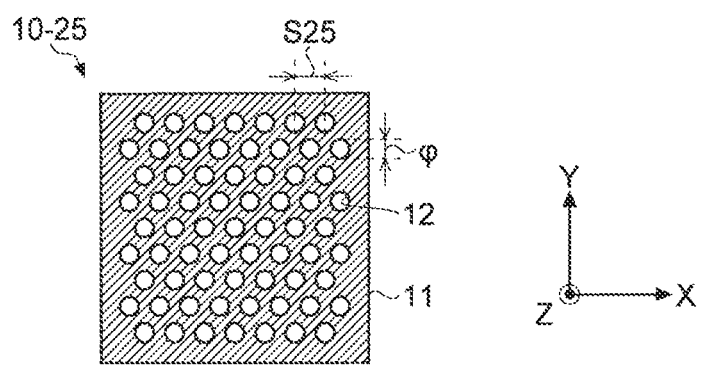
FIG. 15 is a top view showing an example of a schematic configuration of a surface plasmon resonance filter included in a unit pixel positioned in a region where the angle of incidence θ is 25° according to the first embodiment.
Figure 16:
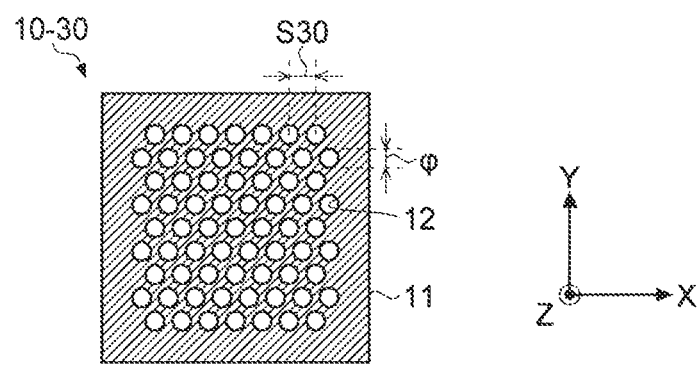
FIG. 16 is a top view showing an example of a schematic configuration of a surface plasmon resonance filter included in a unit pixel positioned in a region where the angle of incidence θ is 30° according to the first embodiment.
Figure 17:
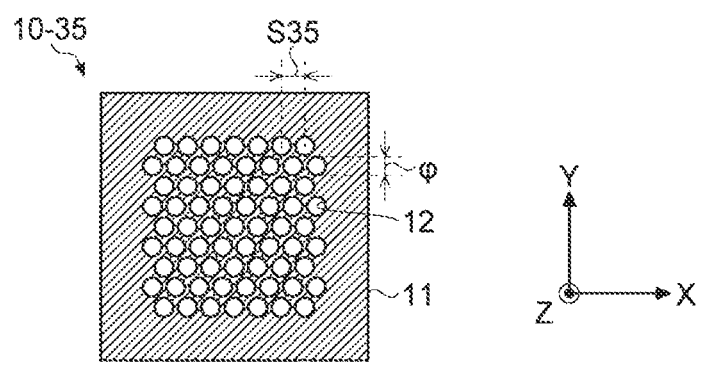
FIG. 17 is a top view showing an example of a schematic configuration of a surface plasmon resonance filter included in a unit pixel positioned in a region where the angle of incidence θ is 35° according to the first embodiment.

FIG. 14 is a top view showing an example of a schematic configuration of a surface plasmon resonance filter included in a unit pixel positioned in a region where the angle of incidence θ is 0. FIG. 15 is a top view showing an example of a schematic configuration of a surface plasmon resonance filter included in a unit pixel positioned in a region where the angle of incidence θ is 25°. FIG. 16 is a top view showing an example of a schematic configuration of a surface plasmon resonance filter included in a unit pixel positioned in a region where the angle of incidence θ is 30°. FIG. 17 is a top view showing an example of a schematic configuration of a surface plasmon resonance filter included in a unit pixel positioned in a region where the angle of incidence θ is 35°.

First, as shown in FIG. 14, a surface plasmon resonance filter 10-0 provided for a unit pixel 110 positioned in a region where the angle of incidence is θ=0°, that is, a region where an imaging height is 0 (near the center of the pixel array unit 101), has a structure in which a period S0 of holes 12 is 350 nm and a hole diameter φ of the holes 12 is 210 nm, for example.

In addition, as shown in FIG. 15, in a surface plasmon resonance filter 10-25 provided for a unit pixel 110 positioned in a region where the angle of incidence is θ=25°, a period S25 of holes 12 is set to 317 nm, for example, according to the aforementioned formula (3) or (4). Further, a hole diameter φ of the holes 12 may be set to 210 nm as in the surface plasmon resonance filter 10-0 with the angle of incidence of θ=0°.

Further, as shown in FIG. 16, in a surface plasmon resonance filter 10-30 provided for a unit pixel 110 positioned in a region where the angle of incidence is θ=30°, a period S30 of holes 12 is set to 300 nm, for example, according to the aforementioned formula (3) or (4). Further, a hole diameter φ of the holes 12 may be set to 210 nm as in the surface plasmon resonance filter 10-0 with the angle of incidence of θ=0°.

Moreover, as shown in FIG. 17, in a surface plasmon resonance filter 10-35 provided for a unit pixel 110 positioned in a region where the angle of incidence is θ=35°, a period S35 of holes 12 is set to 287 nm, for example, according to the aforementioned formula (3) or (4). Further, a hole diameter φ of the holes 12 may be set to 210 nm as in the surface plasmon resonance filter 10-0 with the angle of incidence of 0=0°.

In this manner, pupil correction is performed such that the period S of the holes 12 decreases in a region with a higher imaging height in which the angle of incidence θ of the chief ray increases in the present embodiment. Accordingly, it is possible to acquire image data with accurately split light without depending on an imaging height.

Further, the aforementioned pupil correction may be, for example, performed for each 4-row 4-column unit pattern 21 or for each unit pixel 110. In addition, the aforementioned angles of incidence θ=0°, 25°, 30°, and 35° are merely examples and pupil correction may be performed in more fine angle steps or coarse angle steps. Likewise, pupil correction may be performed in a wider angle range or a narrower angle range.

2.11 Simulation Results

Subsequently, spectral characteristics of the surface plasmon resonance filter 10 with pupil correction are described using simulation results. Meanwhile, in the present simulation, a case in which the material of the metal film 11 is Al (aluminum)-Cu (copper), the thickness of the metal film 11 is 150 nm, the arrangement of the holes 12 is a hexagonal dense arrangement, the period S0 of the holes 12 in the case of the angle of incidence of θ=0° is 350 nm, and the hole diameter φ of the holes 12 is 210 nm is illustrated. However, when the hexagonal dense arrangement is employed as the arrangement of the holes 12, the period S of the holes 12 in a case where incident light has been incident obliquely in the row direction (e.g., X direction in FIG. 14 to FIG. 17) (hereinafter referred to as incidence in the X direction) is not equivalent to that in a case where the incident light has been incident obliquely in the column direction (e.g., Y direction in FIG. 14 to FIG. 17) (hereinafter referred to as incidence in the Y direction), and thus results of simulations performed for both cases are represented in the following description.

Figure 18:
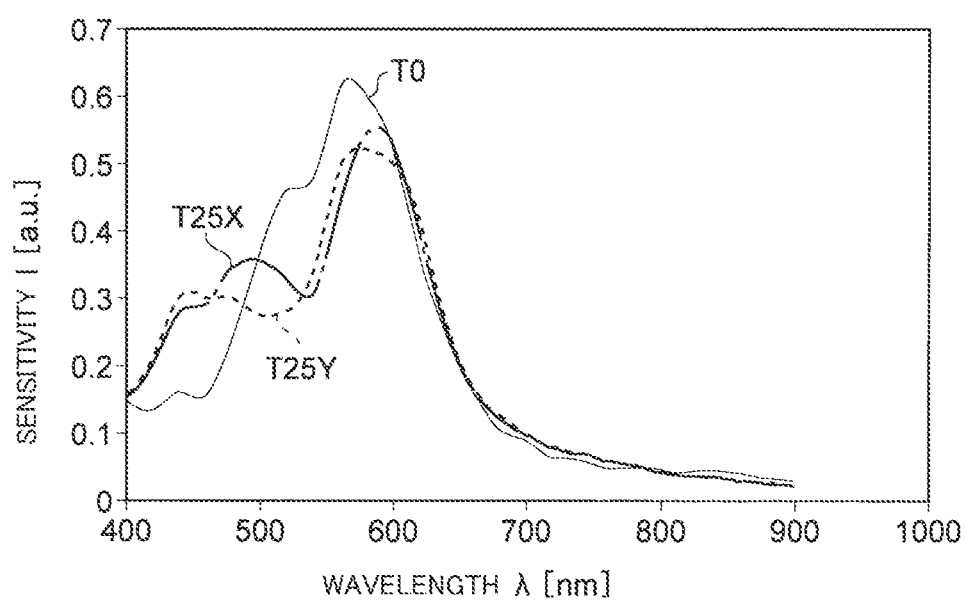
FIG. 18 is a diagram showing spectral characteristics of a surface plasmon resonance filter provided for a unit pixel positioned in a region where the angle of incidence is θ=25° in the case of absence of pupil correction.
Figure 19:
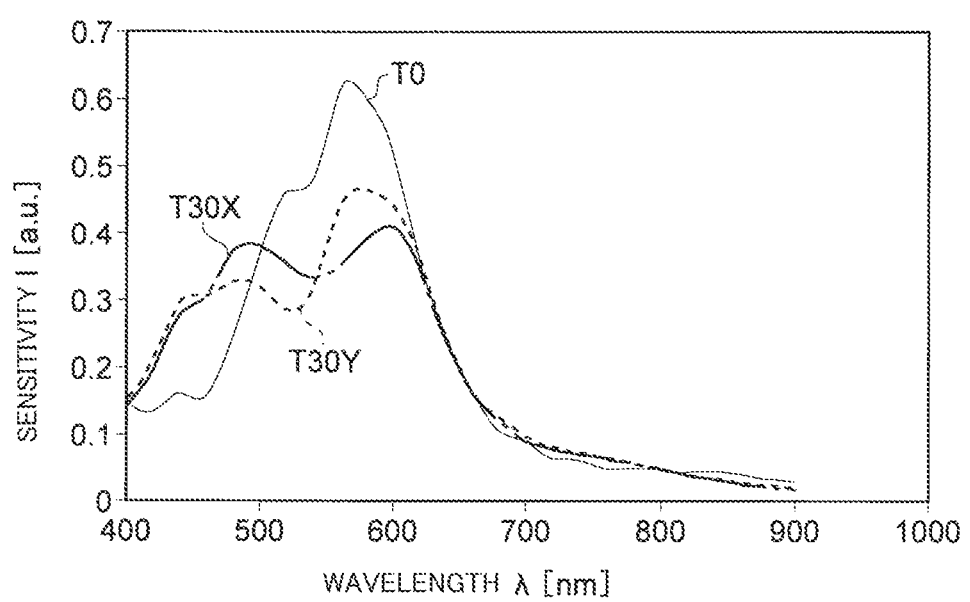
FIG. 19 is a diagram showing spectral characteristics of a surface plasmon resonance filter provided for a unit pixel positioned in a region where the angle of incidence is θ=30° in the case of absence of pupil correction.
Figure 20:
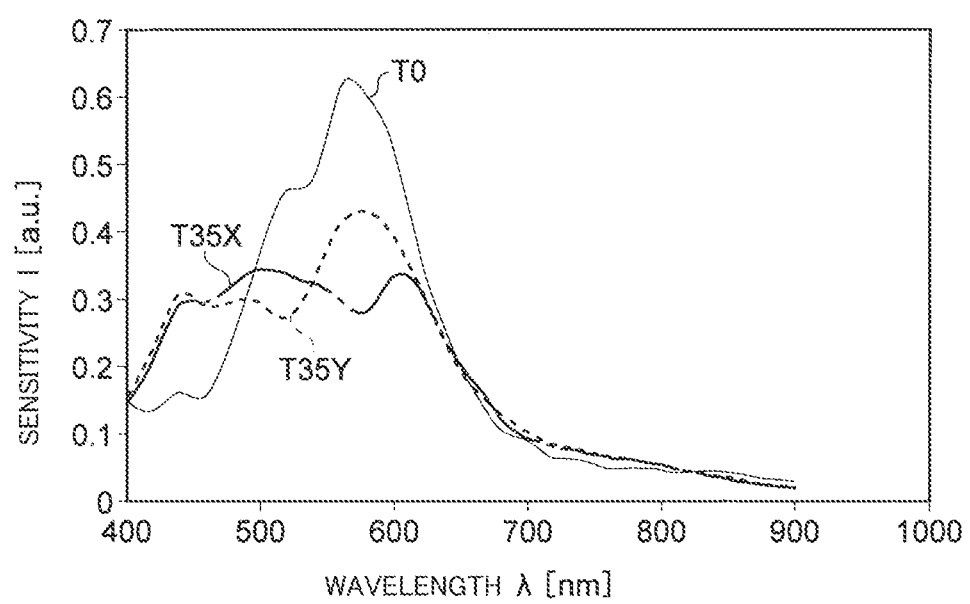
FIG. 20 is a diagram showing spectral characteristics of a surface plasmon resonance filter provided for a unit pixel positioned in a region where the angle of incidence is θ=35° in the case of absence of pupil correction.

FIG. 18 to FIG. 20 are diagrams showing spectral characteristics of surface plasmon resonance filters in the case of absence of pupil correction, FIG. 18 shows spectral characteristics of a surface plasmon resonance filter provided for a unit pixel positioned in a region where the angle of incidence is θ=25°, FIG. 19 shows spectral characteristics of a surface plasmon resonance filter provided for a unit pixel positioned in a region where the angle of incidence is θ=30°, and FIG. 20 shows spectral characteristics of a surface plasmon resonance filter provided for a unit pixel positioned in a region where the angle of incidence is θ=35°.

Figure 21:
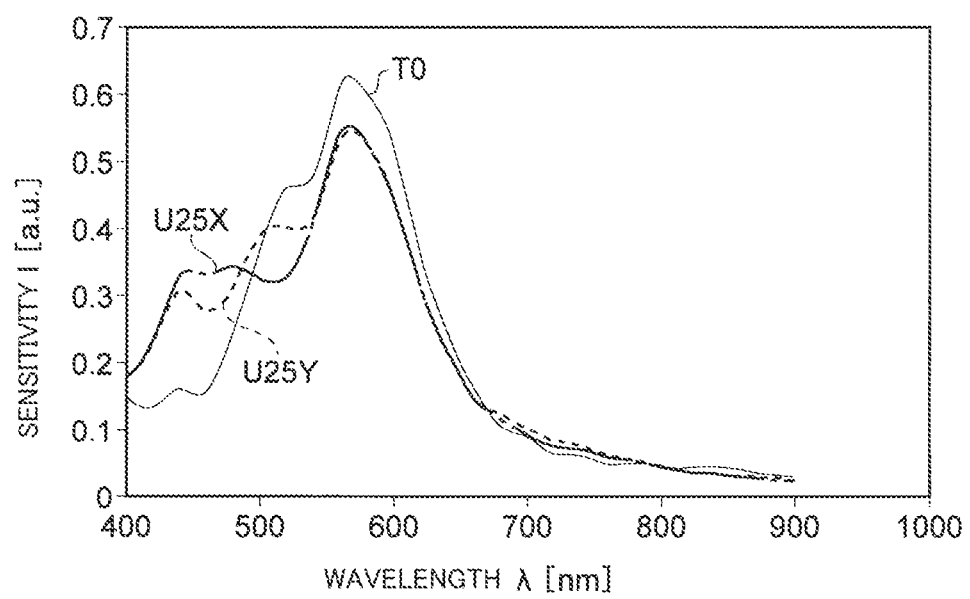
FIG. 21 is a diagram showing spectral characteristics of a surface plasmon resonance filter provided for a unit pixel positioned in a region where the angle of incidence is θ=25° according to the first embodiment.
Figure 22:
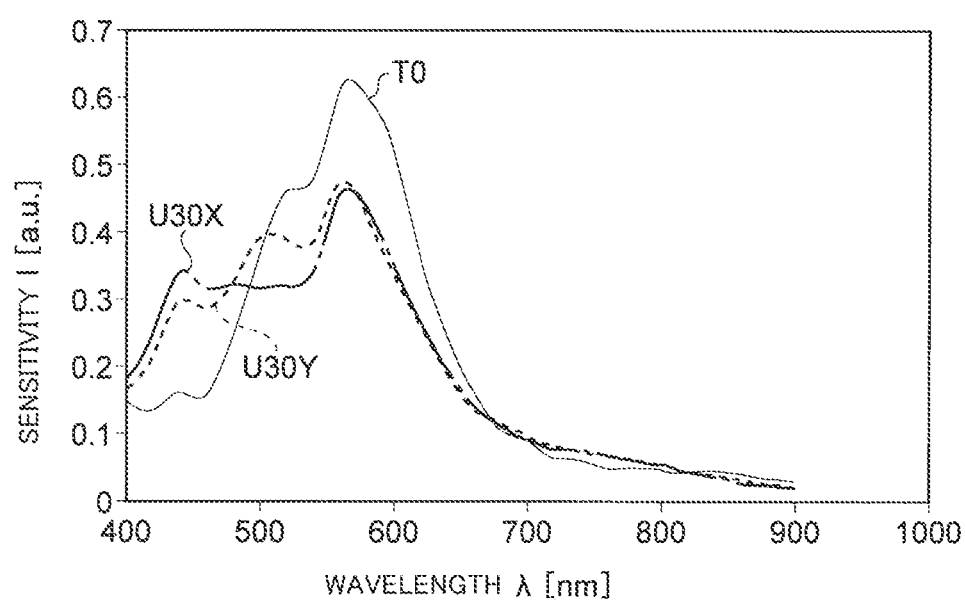
FIG. 22 is a diagram showing spectral characteristics of a surface plasmon resonance filter provided for a unit pixel positioned in a region where the angle of incidence is θ=30° according to the first embodiment.
Figure 23:
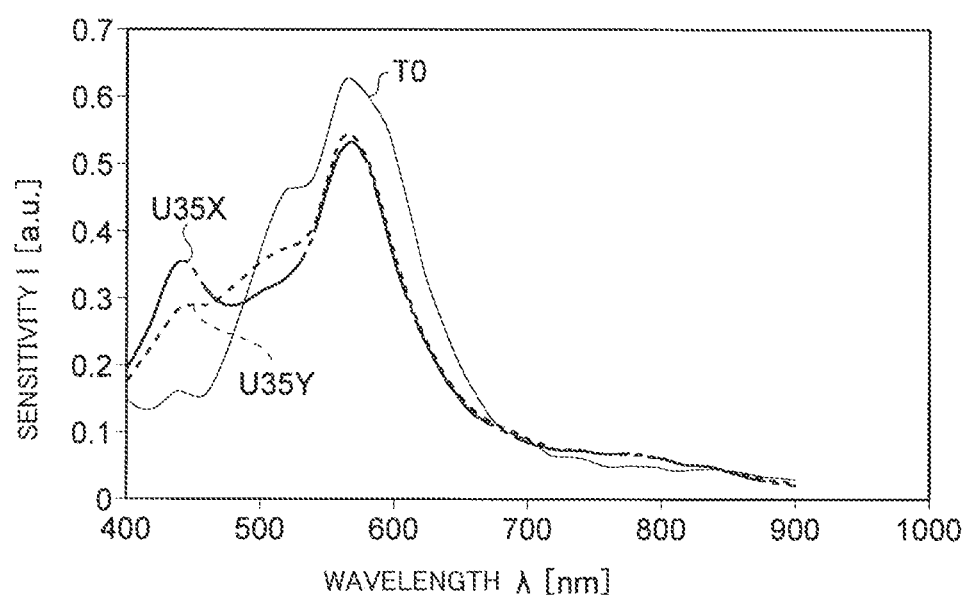
FIG. 23 is a diagram showing spectral characteristics of a surface plasmon resonance filter provided for a unit pixel positioned in a region where the angle of incidence is θ=35° according to the first embodiment.

In addition, FIG. 21 to FIG. 23 are diagrams showing spectral characteristics of surface plasmon resonance filters in the case of presence of pupil correction, FIG. 21 shows spectral characteristics of a surface plasmon resonance filter provided for a unit pixel positioned in a region where the angle of incidence is θ=25°, FIG. 22 shows spectral characteristics of a surface plasmon resonance filter provided for a unit pixel positioned in a region where the angle of incidence is θ=30°, and FIG. 23 shows spectral characteristics of a surface plasmon resonance filter provided for a unit pixel positioned in a region where the angle of incidence is θ=35°.

Further, FIG. 18 to FIG. 23 also show a spectroscopic spectrum T0 of the surface plasmon resonance filter 10-0 (period S0=350 nm, hole diameter φ=210 nm) provided for a unit pixel 110 positioned in a region where the angle of incidence is θ=0°, that is, a region with an imaging height of 0 for comparison.

First, in the case of absence of pupil correction for the period S, in other words, in a case where conditions of period S=350 nm and hole diameter φ=210 nm are fixed, as shown in FIG. 18 to FIG. 20, peak wavelengths have shifted to a longer wavelength in both of spectroscopic spectra T25X, T30X, and T35X of incidence in the X direction and spectroscopic spectra T25Y, T30Y, and T35Y of incidence in the Y direction at the angles of incidence of θ=25°, 30°, and 35°. This can be clearly read on the basis of a peak wavelength of the spectroscopic spectrum T0 of the surface plasmon resonance filter 10-0 (angle of incidence θ=0) represented in FIG. 18 to FIG. 20.

In addition, in both of the spectroscopic spectrum T25X of incidence in the X direction and the spectroscopic spectrum T25Y of incidence in the Y direction, chief peak intensities thereof decrease and a gap between the spectroscopic spectrum T25X of incidence in the X direction and the spectroscopic spectrum T25Y of incidence in the Y direction increases as the angle of incidence θ increases, as shown FIG. 18 to FIG. 20.

On the other hand, in the case of presence of pupil correction for the period S, as shown in FIG. 21 to FIG. 23, shifting of peak wavelengths to a longer wavelength is reduced or canceled in both of the spectroscopic spectra U25X, U30X, and U35X of incidence in the X direction and the spectroscopic spectra U25Y, U30Y, and U35Y of incidence in the Y direction at the angles of incidence of θ=25°, 30°, and 35°.

Specifically, as is clear from a comparison between FIG. 18 and FIG. 21, in both of the spectroscopic spectrum U25X of incidence in the X direction and the spectroscopic spectrum U25Y of incidence in the Y direction, the peak wavelengths thereof can be caused to approximately coincide with the peak wavelength of the spectroscopic spectrum T0 of the surface plasmon resonance filter 10-0 (angle of incidence θ=0) by performing pupil correction on the period S25 of the holes 12 in the surface plasmon resonance filter 10-25 with the angle of incidence of θ=25° on the basis of the aforementioned formula (3) or (4) (e.g., corrected period S25=317 nm).

Likewise, as is clear from a comparison between FIG. 19 and FIG. 22, in both of the spectroscopic spectrum U30X of incidence in the X direction and the spectroscopic spectrum U30Y of incidence in the Y direction, the peak wavelengths thereof can be caused to approximately coincide with the peak wavelength of the spectroscopic spectrum T0 of the surface plasmon resonance filter 10-0 (angle of incidence θ=0) by performing pupil correction on the period S30 of the holes 12 in the surface plasmon resonance filter 10-30 with the angle of incidence of θ=30° on the basis of the aforementioned formula (3) or (4) (e.g., corrected period S30=300 nm).

Likewise, as is clear from a comparison between FIG. 20 and FIG. 23, in both of the spectroscopic spectrum U35X of incidence in the X direction and the spectroscopic spectrum U35Y of incidence in the Y direction, the peak wavelengths thereof can be caused to approximately coincide with the peak wavelength of the spectroscopic spectrum T0 of the surface plasmon resonance filter 10-0 (angle of incidence θ=0) by performing pupil correction on the period S35 of the holes 12 in the surface plasmon resonance filter 10-35 with the angle of incidence of θ=35° on the basis of the aforementioned formula (3) or (4) (e.g., corrected period S35=287 nm).

In addition, as can be ascertained from comparisons of FIG. 18 to FIG. 20 with FIG. 21 to FIG. 23, it is possible to curb deterioration of chief peak intensities of the spectroscopic spectra of incidence in the X direction and the spectroscopic spectra of incidence in the Y direction depending on the angle of incidence θ and reduce gaps between the spectroscopic spectra of incidence in the X direction and the spectroscopic spectra of incidence in the Y direction depending on the angle of incidence θ.

2.12 Operation and Effects

As described above, according to the present embodiment, it is possible to realize the image sensor 100 having satisfactory spectral characteristics in the whole area from a region with a low imaging height to a region with a high imaging height because the phenomenon in which a peak wavelength of spectral characteristics shifts to a longer wavelength depending on the angle of incidence θ can be curbed according to pupil correction. Accordingly, when the image sensor 100 according to the present embodiment is used for evaluation of vegetation states in agricultural applications, and biometric detection of the human skin and the like in biometric recognition applications, correct determination can be performed on the basis of information with high accuracy.

3. Second Embodiment

Next, a solid-state imaging device and an electronic apparatus according to the second embodiment will be described in detail with reference to the drawings. In the following description, redundant description of the same components as those of the first embodiment is omitted by referring to the same.

Even when light has been incident on the center of the incident surface of the surface plasmon resonance filter 10 in a region with a high imaging height in which light is obliquely incident, the light is incident on a position that deviates from the center of the light-receiving surface of the photodiode PD.

Figure 24:
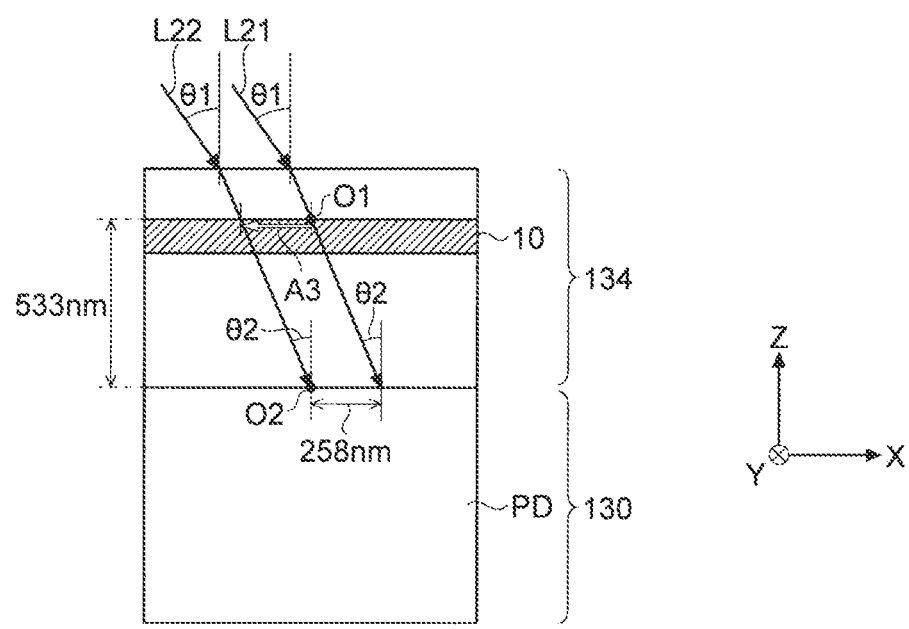
FIG. 24 is a diagram for describing propagation of light incident on an image sensor.

This is described using FIG. 24. Further, a layer structure above the insulating film 134 is omitted in FIG. 24 for simplification of description. In addition, hatching of the insulating film 134 and the semiconductor substrate 130 is omitted in the FIG. 24 for clarification.

As illustrated in FIG. 24, when the insulating film 134 on the semiconductor substrate 130 is formed of silicon oxide ($SiO_2$) with a refractive index of about 1.5, for example, an inclination θ2 of chief rays L21 and L22, which have been obliquely incident at an angle of incidence of θ1=35° in −X direction, in the insulating film 134 becomes 23.3° on the basis of the Snell's law.

Accordingly, when a distance from the incident surface of the surface plasmon resonance filter 10 to the light-receiving surface of the photodiode PD has been set to 533 nm, for example, the chief ray L21 passing through the center O1 of the incident surface of the surface plasmon resonance filter 10 is incident on a position that deviates from the center O2 of the light-receiving surface of the photodiode PD by 258 nm in the X direction.

For the light incident on the position that deviates from the center O2 of the light-receiving surface in this manner, there are cases in which the quantum efficiency of the photodiode PD deteriorates.

On the other hand, the chief ray L22 passing through a position that deviates from the center O1 of the incident surface of the surface plasmon resonance filter 10 by 258 nm in a direction of an arrow A3 (−X direction) can be incident on the center O2 of the light-receiving surface of the photodiode PD.

However, as illustrated in the first embodiment, when pupil correction depending on an imaging height has been applied to the surface plasmon resonance filter 10 of each unit pixel 110, the holes 12 gather near the center of the incident surface of the surface plasmon resonance filter 10 of each unit pixel 110 as the period S of the holes 12 decreases in response to the imaging height, and thus the holes 12 are not present near the outer circumference of the incident surface of the surface plasmon resonance filter 10 of each unit pixel 110 (refer to FIG. 14 to FIG. 17, for example).

Accordingly, there are cases in which the spectral performance of the surface plasmon resonance filter 10 cannot be sufficiently exhibited for light of a chief ray passing through a position that deviates from the center O1 of the incident surface of the surface plasmon resonance filter 10 like the light of the chief ray L22 illustrated in FIG. 24.

Accordingly, in the present embodiment, positions at which the holes 12 are formed are also corrected in addition to pupil correction for the period S of the holes 12 of the surface plasmon resonance filter 10. Specifically, a region in which the holes 12 are formed in each surface plasmon resonance filter 10 (hereinafter referred to as a hole formation region) is shifted such that a chief ray passing through the center O2 of the light-receiving surface of each photodiode PD (e.g., the chief ray L22 in FIG. 24) passes through the center of the hole formation region.

Figure 25:
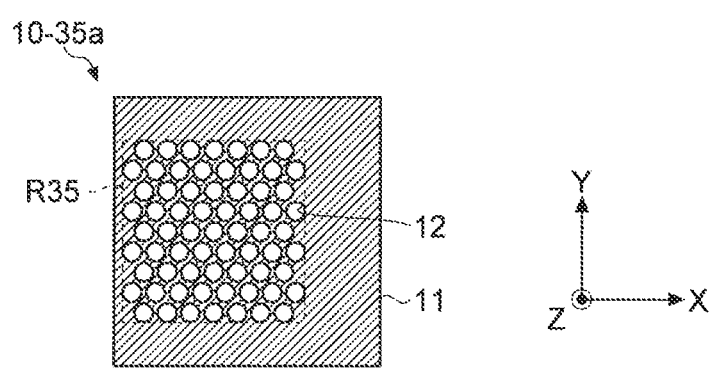
FIG. 25 is a top view showing an example of a schematic configuration of a surface plasmon resonance filter according to a second embodiment (shift amount=−258 nm).
Figure 26:
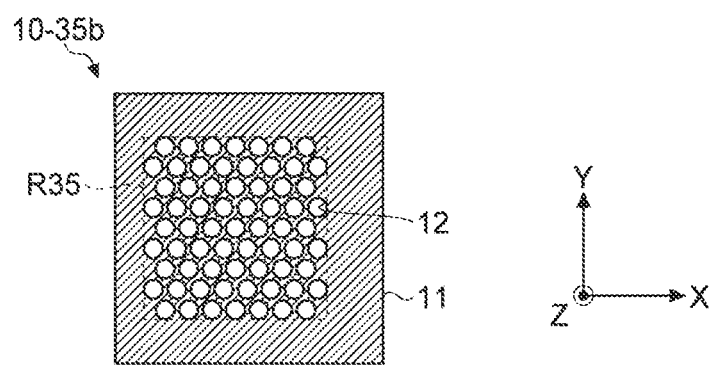
FIG. 26 is a top view showing an example of a schematic configuration of a surface plasmon resonance filter according to a second embodiment (shift amount=−120 nm).
Figure 27:
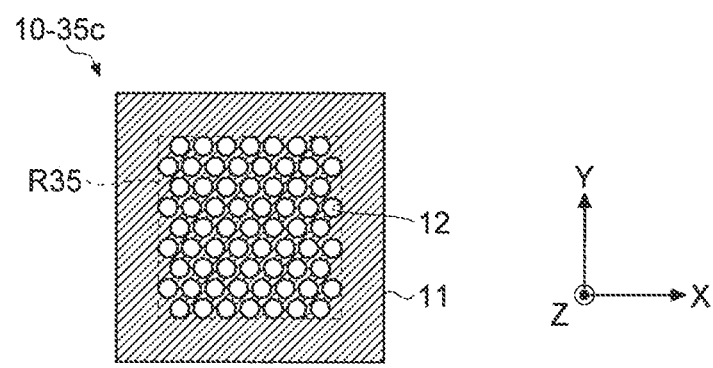
FIG. 27 is a top view showing an example of a schematic configuration of a surface plasmon resonance filter according to the second embodiment (shift amount=0 nm).
Figure 28:
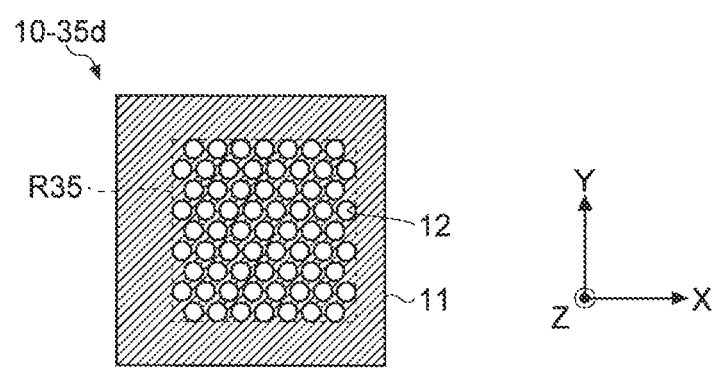
FIG. 28 is a top view showing an example of a schematic configuration of a surface plasmon resonance filter according to the second embodiment (shift amount=120 nm).
Figure 29:
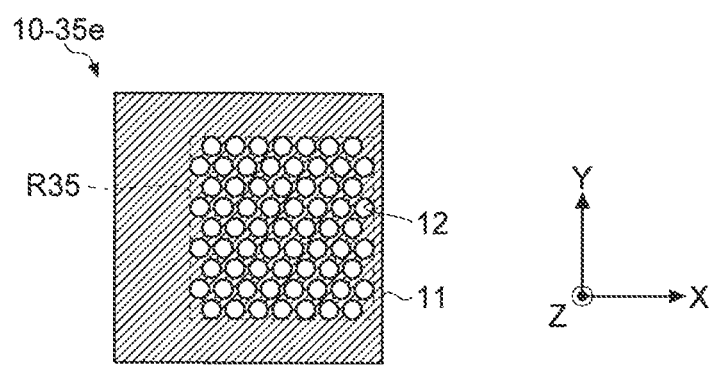
FIG. 29 is a top view showing an example of a schematic configuration of a surface plasmon resonance filter according to the second embodiment (shift amount=258 nm).

FIG. 25 to FIG. 29 are top views showing examples of schematic configurations of surface plasmon resonance filters on which pupil correction has been performed according to the present embodiment in a case where the refractive index of the insulating film is 1.5 and a chief ray is obliquely incident at an angle of incidence of θ=35° in −X direction, in other words, a case where the chief ray is incident at an angle of incidence of θ=35° in the X direction from the −X direction, FIG. 25 shows a surface plasmon resonance filter 10-35a in a case where a hole formation region R35 has been shifted by 258 nm in the −X direction, FIG. 26 shows a surface plasmon resonance filter 10-35b in a case where the hole formation region R35 has been shifted by 120 nm in the −X direction, FIG. 27 shows a surface plasmon resonance filter 10-35c in a case where the hole formation region R35 has been disposed at the center (shift amount=0), FIG. 28 shows a surface plasmon resonance filter 10-35d in a case where the hole formation region R35 has been shifted by 120 nm in the X direction, and FIG. 29 shows a surface plasmon resonance filter 10-35e in a case where the hole formation region R35 has been shifted by 258 nm in the X direction.

Figure 30:
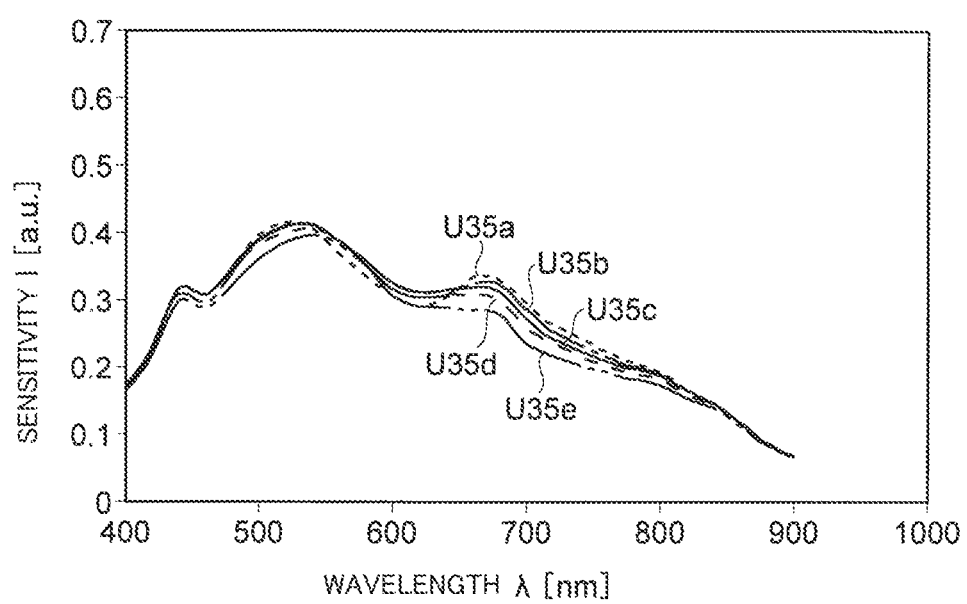
FIG. 30 is a diagram showing spectral characteristics of the surface plasmon resonance filters illustrated in FIG. 25 to FIG. 29 for light incident at an angle of incidence of θ=35°.

In addition, FIG. 30 is a diagram showing spectral characteristics of the surface plasmon resonance filters shown in FIG. 25 to FIG. 29 with respect to a condition in which a chief ray is obliquely incident at an angle of incidence of θ=35° in the X direction. Further, in FIG. 30, a spectral characteristic U35a is the spectral characteristic of the surface plasmon resonance filter 10-35a shown in FIG. 25, a spectral characteristic U35b is the spectral characteristic of the surface plasmon resonance filter 10-35b shown in FIG. 26, a spectral characteristic U35c is the spectral characteristic of the surface plasmon resonance filter 10-35c shown in FIG. 27, a spectral characteristic U35d is the spectral characteristic of the surface plasmon resonance filter 10-35d shown in FIG. 28, and a spectral characteristic U35e is the spectral characteristic of the surface plasmon resonance filter 10-35e shown in FIG. 29.

As shown in FIG. 30, it can be ascertained that the surface plasmon resonance filter 10-35a (refer to FIG. 25) in which the hole formation region R35 has been shifted by 258 nm in the −X direction can provide a satisfactory spectral characteristic with highest sensitivity in a case where the refractive index of the insulating film is 1.5 and the chief ray is obliquely incident at an angle of incident of θ=35° in the −X direction. This represents that the spectral characteristic of the surface plasmon resonance filter 10 can be maximized by shifting the hole formation region R35 such that the chief ray passing through the center of the photodiode PD passes through the center of the hole formation region R35 of the surface plasmon resonance filter As described above, according to the present embodiment, it is possible to realize the image sensor 100 having better spectral characteristics while improving the quantum efficiency of the photodiode PD in the whole area from a region with a low imaging height to a region with a high imaging height because the hole formation region R35 is shifted in response to an imaging height such that a chief ray passing through the center of the photodiode PD passes through the center of the hole formation region R35 of the surface plasmon resonance filter.

Other configurations, operations and effects may be the same as those of the above-described embodiment and thus detailed description thereof is omitted here.

4. Third Embodiment

In the above-described embodiments, a case in which an insulating material such as silicon oxide ($SiO_2$) is used for the passivation film 139 (refer to FIG. 9) has been illustrated. On the other hand, an example in which a passivation film using a resin material is provided instead of the passivation film 139 using an insulating material such as silicon oxide ($SiO_2$) is described in the third embodiment. Meanwhile, in the following description, redundant description of the same components as those of the above-described embodiments is omitted by referring to the same.

Figure 31:
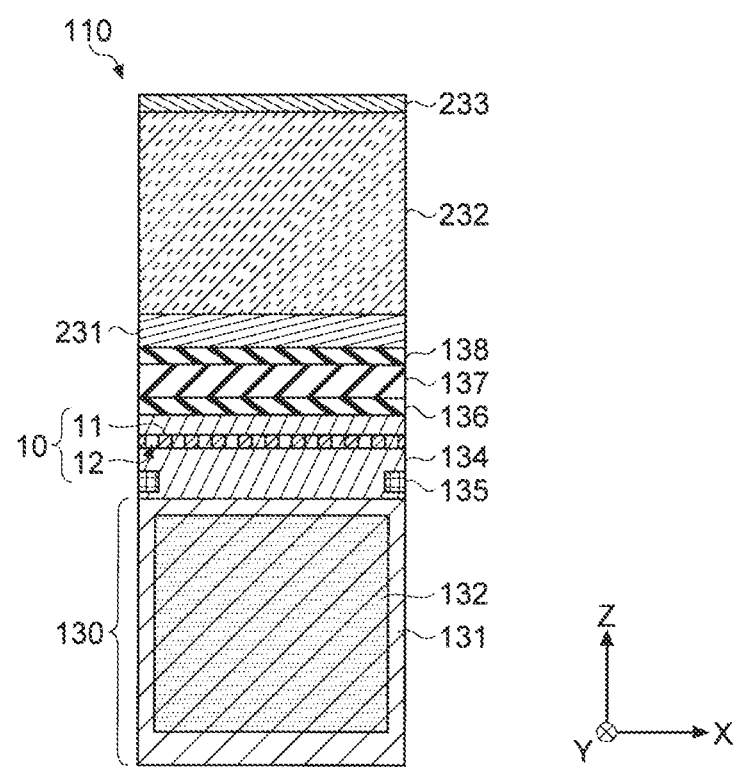
FIG. 31 is a cross-sectional view showing an example of a schematic structure of a unit pixel in an image sensor according to a third embodiment.

FIG. 31 is a cross-sectional view showing an example of a schematic structure of a unit pixel in an image sensor according to the present embodiment. Further, an example of the cross-sectional structure of the light-receiving chip 121 in FIG. 8 is shown and an example of the cross-sectional structure of the circuit chip 122 is omitted in FIG. 31 as in FIG. 9 for simplification of description. In addition, in FIG. 31, a wiring layer for electrical connection from the transfer transistor 111 and the light-receiving chip 121 to the circuit chip 122 is also omitted.

As shown in FIG. 31, the unit pixel 110 according to the present embodiment has a configuration in which the passivation film 139 that is a top layer has been substituted with a stress relaxation film 231, a resin film 232, and an antireflection film 233 in the same configuration as the unit pixel 110 illustrated in FIG. 9.

The resin film 232 is, for example, a film serving as passivation formed using a resin material, and a film thickness thereof can be about 3 μm, for example.

The stress relaxation film 231 between the antireflection film 138 and the resin film 232 may be, for example, a layer formed using a resin material, and a film thickness thereof can be about 0.35 μm, for example.

This stress relaxation film 231 can serve as a layer that absorbs and mitigates a stress generated due to a difference between a linear expansion coefficient of a laminated structure under the antireflection film 138 and a linear expansion coefficient of the resin film 232, and the like. Accordingly, it is possible to reduce peeling off of the resin film 232 caused by an internal stress and an external stress generated due to temperature increase and the like.

In addition, the stress relaxation film 231 can also serve as, for example, a layer for improving adhesion to the antireflection film 138 positioned immediately thereunder. Accordingly, it is possible to reduce peeling off of the resin film 232 at the time of dicing for separating the image sensor 100.

Further, it is also possible to suppress spectral oscillation due to interference of light occurring in spectral characteristics by interposing the stress relaxation film 231 between the antireflection film 138 and the resin film 232.

The antireflection film 233 on the resin film 232 is, for example, a layer for restraining light reflected from the inside of the chip of the image sensor 100 from being totally reflected on the surface of the resin film 232 toward the photodiodes PD again and may be a layer using a resin material having a higher refractive index than that of the material used for the resin film 232, for example. Further, this antireflection film 233 may be omitted.

In addition, it is also possible to facilitate a film formation process by employing a structure in which an upper layer of the image sensor 100 has been substituted with a resin layer, as described above. Accordingly, mass productivity of the image sensor 100 can be improved.

Other configurations, operations and effects may be the same as those of the above-described embodiments and thus detailed description thereof is omitted here.

4.1 Modified Example 1

Figure 32:
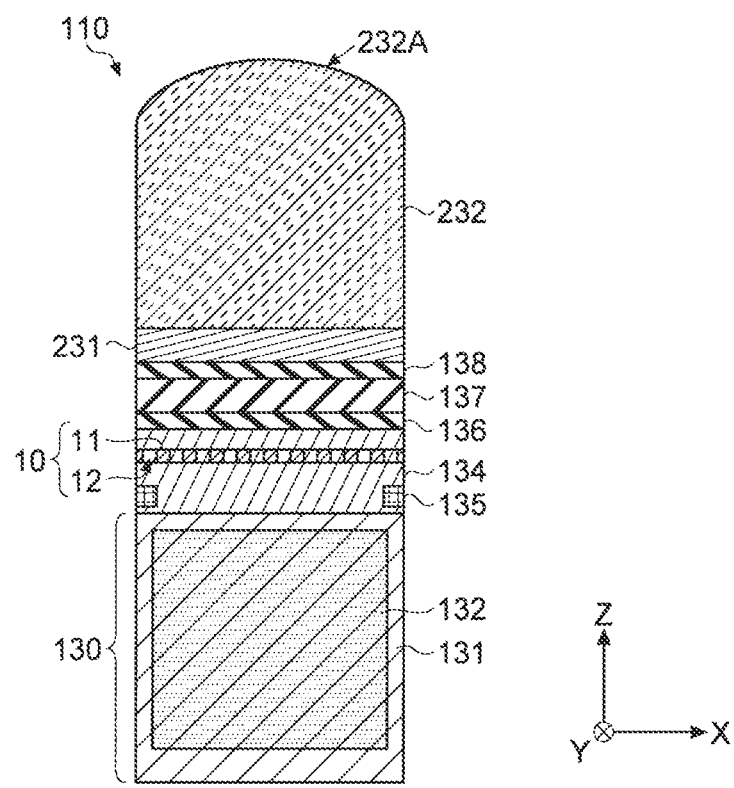
FIG. 32 is a cross-sectional view showing an example of a schematic structure of a unit pixel in an image sensor according to modified example 1 of the third embodiment.

FIG. 32 is a cross-sectional view showing an example of a schematic structure of a unit pixel in an image sensor according to modified example 1 of the third embodiment. As illustrated in FIG. 32, it is also possible to cause the resin film 232 to serve as an on-chip lens for each unit pixel 110 by causing the upper surface 232A of the resin film 232 to have curvature. Accordingly, incident light can be concentrated on the center of the light-receiving surface of the photodiode PD, and thus the sensitivity of each unit pixel 110 can be improved. Meanwhile, the curvature of the upper surface 232A of the resin film 232 can be formed, for example, using a technique such as etching back.

Other configurations, operations and effects may be the same as those of the above-described embodiments and thus detailed description thereof is omitted here.

4.2 Modified Example 2

Figure 33:
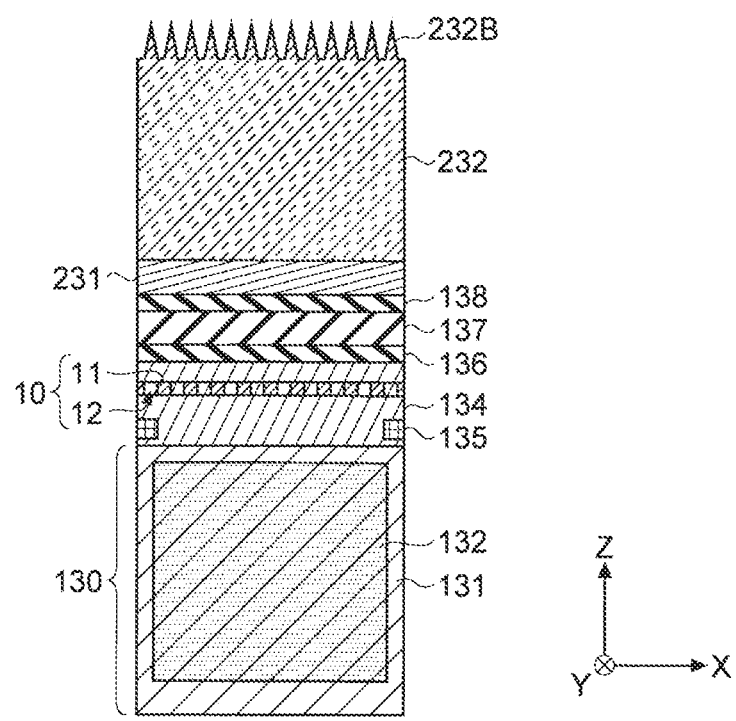
FIG. 33 is a cross-sectional view showing an example of a schematic structure of a unit pixel in an image sensor according to modified example 2 of the third embodiment.

FIG. 33 is a cross-sectional view showing an example of a schematic structure of a unit pixel in an image sensor according to modified example 2 of the third embodiment. As illustrated in FIG. 33, it is also possible to make the surface of the resin film 232 into a moth-eye structure by providing a plurality of convex parts 232B on the surface of the resin film 232.

The convex parts 232B may be arranged on the surface of the resin film 232 in a period (e.g., ⅓λ or less) equal to or less than a chief peak wavelength A in a spectroscopic spectrum of the surface plasmon resonance filter 10, for example. In addition, each convex part 232B may be a protrusion in a shape with a sharp tip, for example. Further, the tip of each convex part 232B may be an acute angle or an obtuse angle.

By making the surface of the resin film 232 into a moth-eye structure in this manner, it is possible to convert an effective refractive index profile in accordance with a chief ray of incident light into a profile that continuously smoothly changes from the refractive index (n=1) of the air to the refractive index of the resin film 232. Accordingly, since the interface of the air layer serving as a reflective surface and the resin film 232 can be optically eliminated, reflectivity for incident light can be reduced to improve light-receiving efficiency.

In addition, it is also possible to reduce oscillation appearing at the time of splitting light due to interference of light according to this configuration, the spectral performance of the surface plasmon resonance filter 10 can also be improved.

Figure 34:
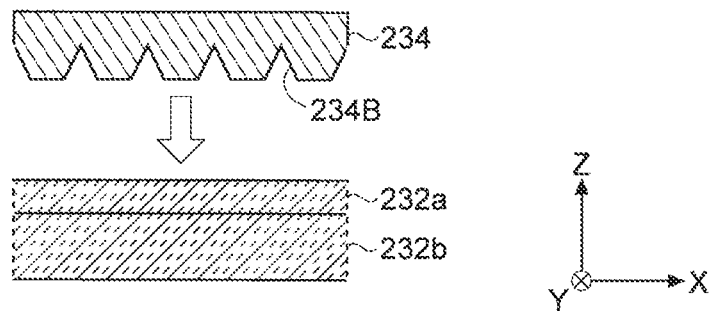
FIG. 34 is a cross-sectional view showing a manufacturing process of a moth-eye structure according to modified example 2 of the third embodiment (1).
Figure 35:
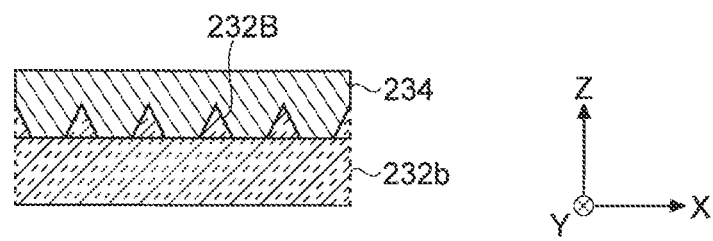
FIG. 35 is a cross-sectional view showing the manufacturing process of the moth-eye structure according to modified example 2 of the third embodiment (2).
Figure 36:
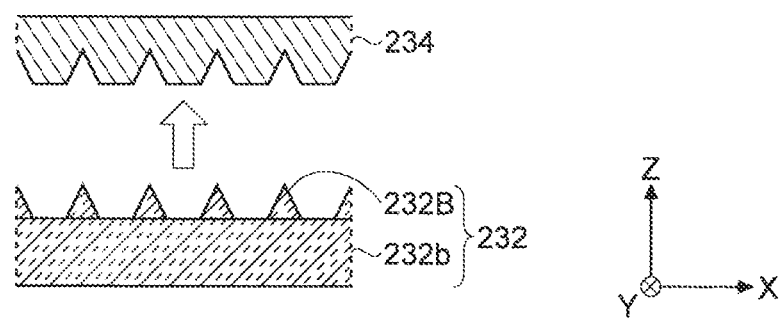
FIG. 36 is a cross-sectional view showing the manufacturing process of the moth-eye structure according to modified example 2 of the third embodiment (3).

FIG. 34 to FIG. 36 are diagrams for describing an example of a manufacturing process for forming a moth-eye structure on the surface of the resin film 232. The moth-eye structure on the surface of the resin film 232 has a problem of a lack of mass productivity because it requires microprocessing of the wavelength A or less. Accordingly, in the present modified example 2, mass productivity is improved by using a nanoimprinting technology. In the following description, it is assumed that up to a resin film 232b that is a base part of the resin film 232 is formed on the stress relaxation film 231 on the back surface of the semiconductor substrate 130.

In execution of the present manufacturing process, a mold 234 having depressions 234B in the same shape as the convex parts 232B, which are arranged like the convex parts 232B, is prepared in advance. This mold 234 can be manufactured, for example, by forming a resist film in a pattern smaller than the order of the wavelength λ on a silicon substrate according to electron beam lithography and anisotropically dry etching the silicon substrate using the resist film as a mask.

When the aforementioned mold 234 is prepared, first, a UV curing resin, for example, is spin-coated on the resin film 232b formed on the back surface of the semiconductor substrate 130, as shown in FIG. 34.

Then, as shown in FIG. 35, the UV curing resin film 232a is hardened by radiating ultraviolet rays thereto in a state in which the surface of the mold 234 on which the depressions 234B are formed is pressed against the UV curing resin film 232a on the resin film 232b.

Thereafter, as shown in FIG. 36, the resin film 232 having a structure in which a plurality of convex parts 232B arranged in a predetermined period are formed on the surface of the resin film 232b is formed by removing the mold 234.

Meanwhile, although a case in which the resin film 232 having the moth-eye structure is directly formed on the back surface of the semiconductor substrate 130 is illustrated in the present modified example 2, the present disclosure is not limited to such as manufacturing process, and a process of manufacturing a substrate having a moth-eye structure separately from the semiconductor substrate 130 and then bonding this substrate and the semiconductor substrate 130 to each other, for example, may be used.

Other configurations, operations and effects may be the same as those of the above-described embodiments and thus detailed description thereof is omitted here.

5. Fourth Embodiment

As mentioned above, shifting of spectral characteristics with respect to obliquely incident light to a longer wavelength may equally occur in a resonance filter using localized surface plasmon according to a filter structure in which metal nanostructures are periodically arranged (hereinafter referred to as a localized surface plasmon resonance filter).

Accordingly, in the fourth embodiment, an example with respect to a case in which a localized surface plasmon resonance filter in which metal nanostructures are periodically arranged is used instead of the surface plasmon resonance filter 10 in the above-described embodiments will be described below. In the following description, redundant description of the same components as those of the first embodiment is omitted by referring to the same.

5.1 Localized Surface Plasmon Resonance Filter

Figure 37:
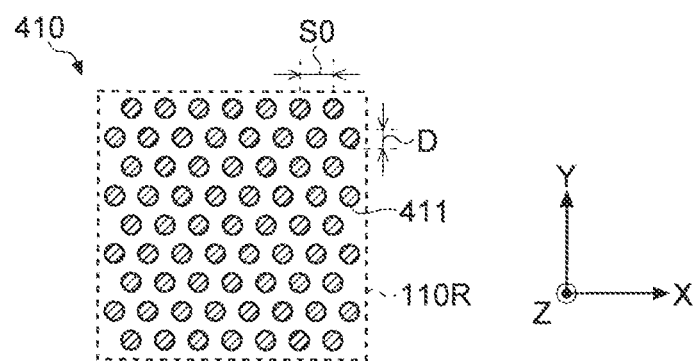
FIG. 37 is a top view showing an example of a schematic configuration of a localized surface plasmon resonance filter according to a fourth embodiment (angle of incidence θ=0).

FIG. 37 is a top view showing an example of a schematic configuration of a localized surface plasmon resonance filter according to the present embodiment. Further, FIG. 37 shows a localized surface plasmon resonance filter 410 provided for a single unit pixel 110.

As shown in FIG. 37, the surface plasmon resonance filter 10 has, for example, a configuration in which a plurality of metal nanostructures 411 are periodically arranged in a pixel region 110R corresponding to each unit pixel 110 contrary to the surface plasmon resonance filter 10 according to the above-described embodiments.

For example, Al (aluminum)-Cu (copper) and the like can be used for the metal nanostructures 411 like the metal film 11. However, the material of the metal nanostructures 411 is not limited thereto, and various metal materials capable of generating localized surface plasmon, such as aluminum (Al), an aluminum alloy, gold (Au), and silver (Ag), can be used.

In addition, a diameter D of an upper bottom surface of each metal nanostructure 411 and a period S of the metal nanostructures 411 may be, for example, the same as the hole diameter φ and the period S of the holes 12 in the above-described embodiments. Furthermore, the height of the metal nanostructures 411 can be the same as the film thickness of the metal film 11, for example, 150 nm.

For example, a dielectric may be buried in regions between the metal nanostructures 411. The same insulating material as the insulating film 134 can be used for this dielectric. Accordingly, it is possible to facilitate a manufacturing process of the insulating film 134 and the localized surface plasmon resonance filter 410.

Further, the shape of the upper bottom surface of each metal nanostructure 411 is not limited to a circle and may be modified into various shapes such as an ellipse, regular polygons such as a square and a regular hexagon, a rectangle, and a rhomboid.

In addition, the arrangement of the metal nanostructures 411 is not limited to the arrangement having a rhomboid arrangement as a unit cell (also referred to as a hexagonal dense arrangement), as illustrated in FIG. 37, and may be modified into various configurations in which the metal nanostructures 411 are periodically arranged at equal intervals, such as a square arrangement in which the metal nanostructures 411 are arranged in row and column directions.

5.2 Pupil Correction

The localized surface plasmon resonance filter 410 having the aforementioned configuration can control spectral characteristics by controlling the period S and/or the diameter D of the metal nanostructures 411 serving as a diffraction grating like the surface plasmon resonance filter 10 according to the above-described embodiments (refer to FIG. 1 and FIG. 2, for example). Accordingly, in the present embodiment, shifting of a peak wavelength of a spectroscopic spectrum to a longer wavelength occurring in a region with a high imaging height is reduced according to pupil correction by controlling the period S and/or the diameter D of the metal nanostructures 411 as in the above-described embodiments.

Meanwhile, since details of pupil correction according to the present embodiment are the same as pupil correction described using FIG. 12 and FIG. 13 in the first embodiment, detailed description is omitted here.

5.3 Localized Surface Plasmon Resonance Filter with Pupil Correction

Subsequently, an example of a structure of the localized surface plasmon resonance filter 410 with pupil correction will be described below.

Figure 38:
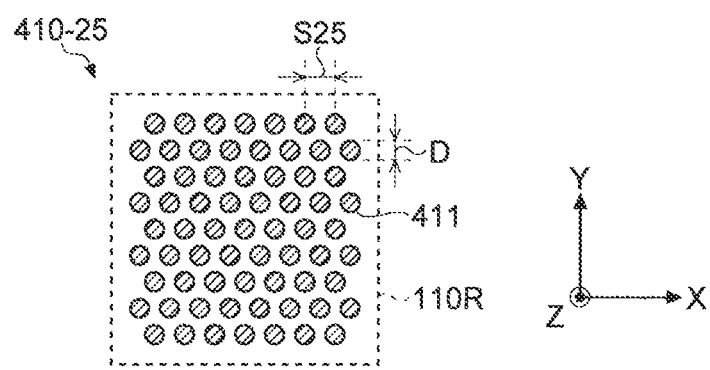
FIG. 38 is a top view showing an example of a schematic configuration of a localized surface plasmon resonance filter included in a unit pixel positioned in a region where the angle of incidence θ is 25° according to the fourth embodiment.
Figure 39:
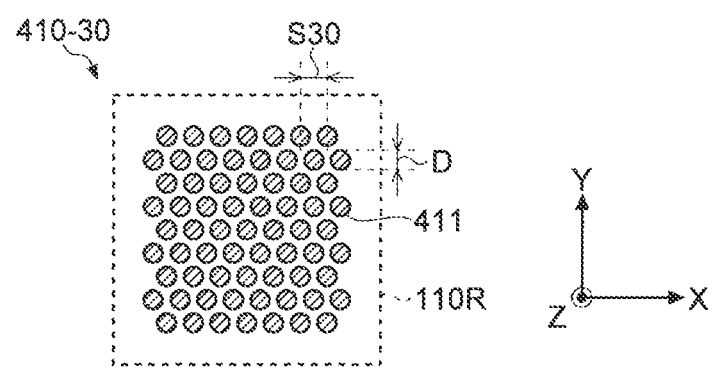
FIG. 39 is a top view showing an example of a schematic configuration of a localized surface plasmon resonance filter included in a unit pixel positioned in a region where the angle of incidence θ is 30° according to the fourth embodiment.
Figure 40:
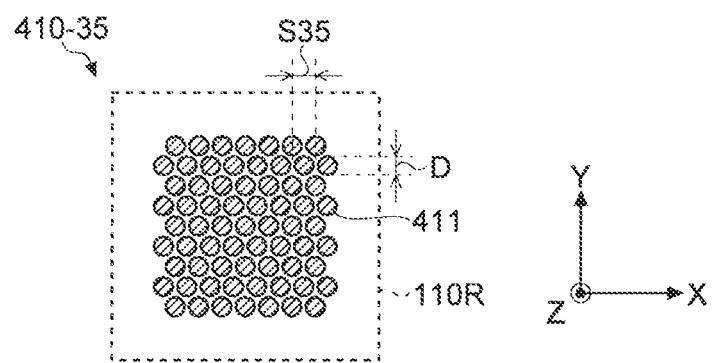
FIG. 40 is a top view showing an example of a schematic configuration of a localized surface plasmon resonance filter included in a unit pixel positioned in a region where the angle of incidence θ is 35° according to the fourth embodiment.

FIG. 38 is a top view showing an example of a schematic configuration of a localized surface plasmon resonance filter included in a unit pixel positioned in a region where the angle of incidence θ is 25°. FIG. 39 is a top view showing an example of a schematic configuration of a localized surface plasmon resonance filter included in a unit pixel positioned in a region where the angle of incidence θ is 30°. FIG. 40 is a top view showing an example of a schematic configuration of a localized surface plasmon resonance filter included in a unit pixel positioned in a region where the angle of incidence θ is 35°. Further, an example of a schematic configuration of a localized surface plasmon resonance filter included in a unit pixel positioned in a region where the angle of incidence θ is 0 is the same as the localized surface plasmon resonance filter 410 shown in FIG. 37, and thus the localized surface plasmon resonance filter 410 shown in FIG. 37 is referred to here.

First, as shown in FIG. 37, the localized surface plasmon resonance filter 410 provided for a unit pixel 110 positioned in a region in which the angle of incidence is θ=0°, that is, a region in which an imaging height is 0 (near the center of the pixel array unit 101) has, for example, a structure in which a period S0 of the metal nanostructures 411 is 350 nm and a diameter D of each metal nanostructure 411 is 210 nm.

In addition, as shown in FIG. 38, in the localized surface plasmon resonance filter 410-25 provided for a unit pixel 110 positioned in a region in which the angle of incidence is θ=25°, for example, a period S25 of the metal nanostructures 411 is set to 317 nm according to the aforementioned formula (3) or (4). Further, a diameter D of each metal nanostructure 411 may be 210 nm as in the localized surface plasmon resonance filter 410 with the angle of incidence of θ=0°.

Furthermore, as shown in FIG. 39, in the localized surface plasmon resonance filter 410-30 provided for a unit pixel 110 positioned in a region in which the angle of incidence is θ=30°, for example, a period S30 of the metal nanostructures 411 is set to 300 nm according to the aforementioned formula (3) or (4). Further, a diameter D of each metal nanostructure 411 may be 210 nm as in the localized surface plasmon resonance filter 410 with the angle of incidence of θ=0°.

Moreover, as shown in FIG. 40, in the localized surface plasmon resonance filter 410-35 provided for a unit pixel 110 positioned in a region in which the angle of incidence is θ=35°, for example, a period S35 of the metal nanostructures 411 is set to 287 nm according to the aforementioned formula (3) or (4). Further, a diameter D of each metal nanostructure 411 may be 210 nm as in the localized surface plasmon resonance filter 410 with the angle of incidence of θ=0°.

In this manner, pupil correction is performed such that the period S of the metal nanostructures 411 decreases in a region with a higher imaging height in which the angle of incidence θ of a chief ray increases in the present embodiment. Accordingly, it is possible to acquire image data with accurately split light without depending on an imaging height.

Meanwhile, the aforementioned pupil correction may be performed, for example, for each 4-row 4-column unit pattern 21 illustrated in FIG. 11 or for each unit pixel 110. In addition, the aforementioned angles of incidence θ=0°, 25°, 30°, and 35° are merely examples and pupil correction may be performed in more fine angle steps or coarse angle steps. Likewise, pupil correction may be performed in a wider angle range or a narrower angle range.

5.4 Operation and Effects

By employing the aforementioned configuration, it is possible to realize the image sensor 100 having satisfactory spectral characteristics in the whole area from a region with a low imaging height to a region with a high imaging height because the phenomenon in which peak wavelengths of spectral characteristics shift to a longer wavelength depending on the angle of incidence θ can be curbed according to pupil correction as in the above-described embodiments. Accordingly, when the image sensor 100 according to the present embodiment is used for evaluation of vegetation states in agricultural applications, and biometric detection of the human skin and the like in biometric recognition applications, correct determination can be performed on the basis of information with high accuracy.

Meanwhile, in the present embodiment, although a case in which the surface plasmon resonance filter 10 has been substituted with the localized surface plasmon resonance filter 410 has been illustrated on the basis of the first embodiment, the present disclosure is not limited thereto and other embodiments such as the second embodiment and the third embodiment may be used as a base.

Other configurations, operations, and effects may be the same as those of the above-described embodiments, and thus detailed description is omitted here.

6. Fifth Embodiment

As mentioned above, the image sensors 100 according to the above-described embodiments can be used as agricultural and medical image sensors. Accordingly, in the fifth embodiment, a case in which the image sensors 100 according to the above-described embodiments are applied to a normalized difference vegetation index (NDVI) such as agriculture and fosterage of vegetation is described.

Figure 41:
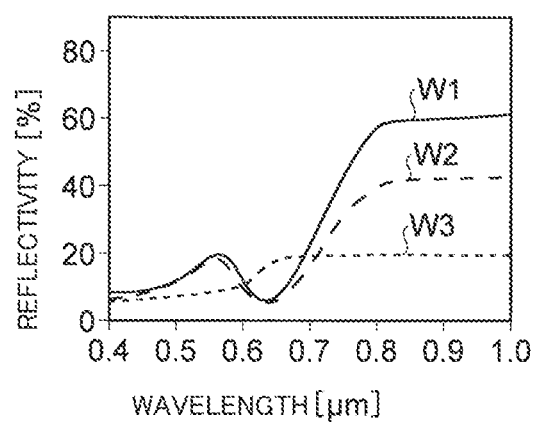
FIG. 41 is a diagram showing spectral characteristics of reflectivities of plants.

FIG. 41 is a diagram showing spectral characteristics of reflectivities of plants. Further, in FIG. 41, a spectral characteristic W1 shows a reflectivity of healthy plants, a spectral characteristic W2 shows a reflectivity of weak plants, and a spectral characteristic W3 shows a spectral characteristic of dead plants. Further, a reflectivity of plants may be a value determined by a reflectivity of mainly leaves of the planes.

As shown in FIG. 41, reflectivities of plants in a band of wavelengths of 600 to 800 nm largely change depending on vegetation states of the plants. Accordingly, it is possible to determine a vegetation state of plants by obtaining multiple spectral characteristics according to two or more wavelength components in two bands having at least the wavelengths of 600 to 800 nm therebetween or within the band of the wavelengths of 600 to 800 nm.

For example, a reflectivity of plants may be measured in a band of wavelength of 600 to 700 nm and may additionally be measured in a band of wavelengths of 700 to 800 nm to determine a vegetation state of the plants from a relationship between the measured two reflectivities.

Otherwise, a reflectivity of plants may be measured in a band of wavelength of 400 to 600 nm and may additionally be measured in a band of wavelengths of 800 to 1000 nm to determine a vegetation state of the plants from a relationship between the measured two reflectivities.

Furthermore, to improve determination accuracy, a configuration in which reflectivities of plants are measured in three or more bands may be employed.

It is also possible to determine growing states of crops in a wide range by employing a configuration in which one or more image sensors 100 that measure reflectivities in two or more bands as described above are mounted in an unmanned aircraft such as a drone, a manned aircraft such as a helicopter or a small plane, or the like to observe growing states of crops from the sky.

Further, determination of a vegetation state of plants may be executed, for example, by the processor 1040 (refer to FIG. 5) on the basis of image data acquired through the image sensor 100 or by an external server or the like by transmitting the image data to the external server or the like.

7. Sixth Embodiment

In addition, in the sixth embodiment, a case in which the image sensors 100 according to the above-described embodiments are applied to biometric authentication will be described.

Figure 42:
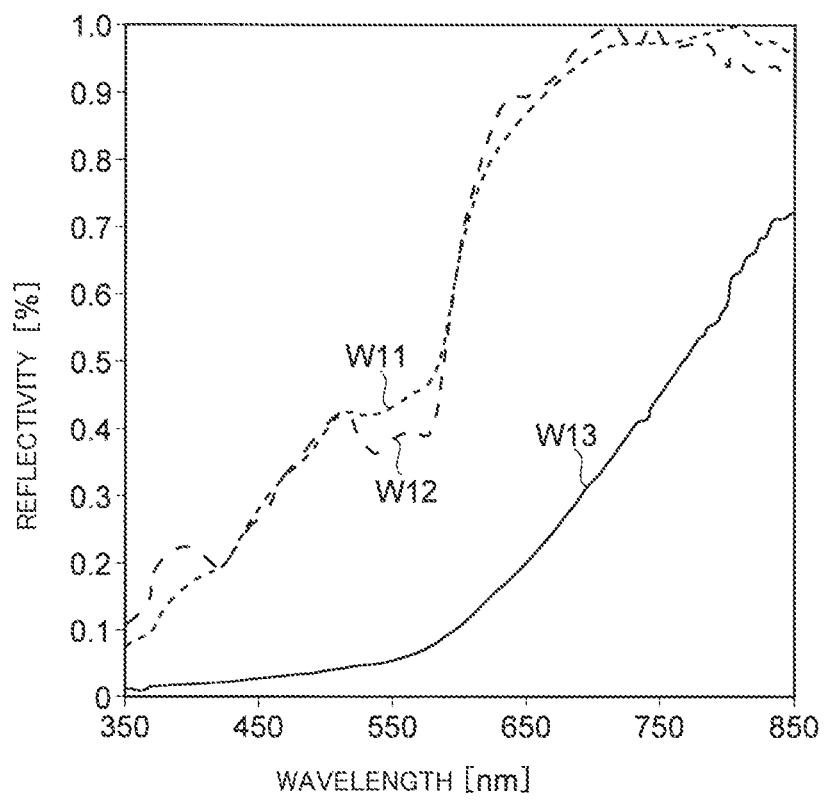
FIG. 42 is a diagram showing spectral characteristics of reflectivities of human skins.

FIG. 42 is a diagram showing spectral characteristics of reflectivities of human skins. Further, in FIG. 42, a spectral characteristic W11 shows a reflectivity of the Mongoloid, a spectral characteristic W12 shows a reflectivity of the White race, and a spectral characteristic W13 shows a reflectivity of the Negroid.

As shown in FIG. 42, a reflectivity of a person in a band of wavelengths of 450 to 650 nm largely changes depending on the race of the person. Such a reflectivity change can be used to authenticate whether a subject is a human skin.

For example, it is possible to determine whether a subject is a human skin by detecting three spectra of wavelengths of 450 nm, 550 nm, and 650 nm. This is because, if the subject is an object other than a human skin, a reflectivity change is different from those illustrated in FIG. 42.

By using this feature of reflectivity change, it is possible to construct an authentication system capable of preventing forgery of a face, a fingerprint, an iris, and the like to realize biometric authentication with higher accuracy.

Further, biometric authentication may be, for example, executed by the processor 1040 (refer to FIG. 5) on the basis of image data acquired through the image sensor 100 or by an external server or the like by transmitting the image data to the external server or the like.

Although embodiments of the present disclosure have been described above, the technical scope of the present disclosure is not limited to the above-described embodiments and can be modified in various manners without departing from the essential characteristics of the present disclosure. In addition, components in different embodiments and modified examples may be appropriately combined.

The effects in each embodiment described in the present description are merely illustrative and not restrictive, and other effects may be obtained.

Further, the present technology may also be configured as below.

(1)

A solid-state imaging device including:

a pixel array unit in which a plurality of photoelectric conversion elements are arranged in a two-dimensional lattice form;

a plurality of diffraction gratings provided in one-to-one corresponding to light-receiving surfaces of the plurality of photoelectric conversion elements; and pixel circuits configured to generate pixel signals on the basis of charge accumulated in the photoelectric conversion elements, wherein a period of a first diffraction grating positioned at a first imaging height is different from a period of a second diffraction grating positioned at a second imaging height different from the first imaging height.

(2)

The solid-state imaging device according to (1), wherein, when a period of the diffraction grating positioned at the center of the pixel array unit is $S_0$ and a period of the diffraction grating present at a position at which a chief ray of incident light is inclined at an angle $\theta$ is $S_1$, the following formula (7) is satisfied.

[Math. 7]

$$S_1 = \left(\frac{1}{1+\sin\theta}\right) \times S_0 \qquad (7)$$

(3)

The solid-state imaging device according to (1), wherein, when a period of the diffraction grating positioned at the center of the pixel array unit is $S_0$ and a period of the diffraction grating present at a position at which a chief ray of incident light is inclined at an angle $\theta$ is $S_1$, the following formula (8) is satisfied.

[Math. 8]

$$S_1 = \cos\theta \times S_0 \qquad (8)$$

(4)

The solid-state imaging device according to any one of (1) to (3), wherein positions of the diffraction gratings with respect to the light-receiving surfaces of the photoelectric conversion elements corresponding to the diffraction gratings differ depending on imaging heights of places where the diffraction gratings are positioned.

(5)

The solid-state imaging device according to (4), wherein the positions of the diffraction gratings with respect to the light-receiving surfaces of the photoelectric conversion elements corresponding to the diffraction gratings shift depending on the imaging heights of the places where the diffraction gratings are positioned in the same direction as a direction in which a chief ray of incident light incident on the diffraction gratings is inclined, which is parallel to the light-receiving surfaces.

(6)

The solid-state imaging device according to any one of (1) to (5), wherein each of the diffraction gratings is a propagation type surface plasmon resonance filter including a metal film in which a plurality of holes are periodically arranged.

(7)

The solid-state imaging device according to any one of (1) to (5), wherein each of the diffraction gratings is a localized surface plasmon resonance filter in which a plurality of metallic columnar structures are periodically arranged.

(8)

The solid-state imaging device according to any one of (1) to (7), wherein the plurality of diffraction gratings include a third diffraction grating that selectively transmits light of a first wavelength component and a fourth diffraction grating that selectively transmits light of a second wavelength component different from the first wavelength component.

(9)

The solid-state imaging device according to (8), wherein the light of the first wavelength component is infrared light.

(10)

The solid-state imaging device according to any one of (1) to (9), including a resin film positioned on a side opposite to the photoelectric conversion elements having the diffraction gratings between the resin film and the photoelectric conversion elements.

(11)

The solid-state imaging device according to (10), wherein the surface of the resin film has curvature.

(12)

The solid-state imaging device according to (10), wherein the surface of the resin film has a moth-eye structure in which a plurality of convex parts are periodically arranged.

(13)

An electronic apparatus including:

a solid-state imaging device;

an optical system configured to image incident light on a light-receiving surface of the solid-state imaging device; and a processor configured to control the solid-state imaging device, wherein the solid-state imaging device includes:

a pixel array unit in which a plurality of photoelectric conversion elements are arranged in a two-dimensional lattice form;

a plurality of diffraction gratings provided corresponding one-to-one to light-receiving surfaces of the plurality of photoelectric conversion elements; and a pixel circuit configured to generate a pixel signal on the basis of charge accumulated in each of the photoelectric conversion elements, wherein a period of a first diffraction grating positioned at a first imaging height is different from a period of a second diffraction grating positioned at a second imaging height different from the first imaging height.

(14)

The electronic apparatus according to (13), wherein the processor determines a vegetation state of plants on the basis of image data captured by the solid-state imaging device.

(15)

The electronic apparatus according to (13), wherein the processor executes biometric authentication of a subject on the basis of image data captured by the solid-state imaging device.

REFERENCE SIGNS LIST 10, 10-0, 10-25, 10-30, 10-35, 10-35a, 10-35b, 10-35c, 10-35d, 10-35e Surface plasmon resonance filter
11 Metal film
12 Hole
13 Surface plasmon
14 Lens
20 Color filter arrangement
21 Unit pattern
100 Solid-state imaging device
101 Pixel array unit
102 Vertical driving circuit
103 Column processing circuit
104 Horizontal driving circuit
105 System control unit
108 Signal processing unit
109 Data storage unit
110 Unit pixel
110R Pixel region
111 Transfer transistor
112 Reset transistor
113 Amplification transistor
114 Select transistor
121 Light-receiving chip
122 Circuit chip
130 Semiconductor substrate
131 P type semiconductor region
132 N type semiconductor region
134 Insulating film
135 Light-shielding film
136, 138, 233 Antireflection film
137 Antioxidation film
139 Passivation film
231 Stress relaxation film
232, 232b Resin film
232a UV curing resin film
232A Upper surface
232B Convex part
234 Mold
410, 410-25, 410-30, 410-35 Localized surface plasmon resonance filter
411 Metal nanostructure
1000 Electronic apparatus
1020 Imaging lens
1030 Storage unit
1040 Processor
L1 to L3 Light
L10 Chief ray
L11 Incident light
LD Pixel drive line
LD111 Transfer transistor drive line
LD112 Reset transistor drive line
LD114 Select transistor drive line
O1, O2 Center
PD Photodiode
R35 Hole formation region
VSL Vertical signal line

What is claimed is:

1. A solid-state imaging device, comprising:
a pixel array unit in which a plurality of photoelectric conversion elements are arranged in a two-dimensional lattice form;
a plurality of diffraction gratings provided corresponding one-to-one to light-receiving surfaces of the plurality of photoelectric conversion elements; and
pixel circuits configured to generate pixel signals on a basis of charge accumulated in the photoelectric conversion elements,
wherein a period of a first diffraction grating positioned at a first imaging height is different from a period of a second diffraction grating positioned at a second imaging height different from the first imaging height, and
wherein, when a period of a diffraction grating positioned at a center of the pixel array unit is $S_0$ and a period of a diffraction grating present at a position at which a chief ray of incident light is inclined at an angle $$S_1 = \left(\frac{1}{1 + \sin\theta}\right) \times S_0$$

is satisfied.

2. The solid-state imaging device according to claim 1, wherein positions of the diffraction gratings with respect to the light-receiving surfaces of the photoelectric conversion elements corresponding to the diffraction gratings differ depending on imaging heights of places where the diffraction gratings are positioned.

3. The solid-state imaging device according to claim 2, wherein the positions of the diffraction gratings with respect to the light-receiving surfaces of the photoelectric conversion elements corresponding to the diffraction gratings shift depending on the imaging heights of the places where the diffraction gratings are positioned in a same direction as a direction in which a chief ray of incident light incident on the diffraction gratings is inclined, which is parallel to the light-receiving surfaces.

4. The solid-state imaging device according to claim 1, wherein each of the diffraction gratings is a propagation type surface plasmon resonance filter including a metal film in which a plurality of holes are periodically arranged.

5. The solid-state imaging device according to claim 1, wherein each of the diffraction gratings is a localized surface plasmon resonance filter in which a plurality of metallic columnar structures are periodically arranged.

6. The solid-state imaging device according to claim 1, wherein the plurality of diffraction gratings include a third diffraction grating that selectively transmits light of a first wavelength component and a fourth diffraction grating that selectively transmits light of a second wavelength component different from the first wavelength component.

7. The solid-state imaging device according to claim 6, wherein the light of the first wavelength component is infrared light.

8. The solid-state imaging device according to claim 1, comprising a resin film positioned on a side opposite to the photoelectric conversion elements having the diffraction gratings between the resin film and the photoelectric conversion elements.

9. The solid-state imaging device according to claim 8, wherein the surface of the resin film has curvature.

10. The solid-state imaging device according to claim 8, wherein the surface of the resin film has a moth-eye structure in which a plurality of convex parts are periodically arranged.

11. A solid-state imaging device, comprising:
a pixel array unit in which a plurality of photoelectric conversion elements are arranged in a two-dimensional lattice form;
a plurality of diffraction gratings provided corresponding one-to-one to light-receiving surfaces of the plurality of photoelectric conversion elements; and
pixel circuits configured to generate pixel signals on a basis of charge accumulated in the photoelectric conversion elements,
wherein a period of a first diffraction grating positioned at a first imaging height is different from a period of a second diffraction grating positioned at a second imaging height different from the first imaging height,
and wherein, when a period of a diffraction grating positioned at a center of the pixel array unit is $S_0$ and a period of a diffraction grating present at a position at which a chief ray of incident light is inclined at an angle $\theta$ is $S_1$, a formula $S_1 = \cos\theta \times S_0$ is satisfied.

12. The solid-state imaging device according to claim 11, wherein positions of the diffraction gratings with respect to the light-receiving surfaces of the photoelectric conversion elements corresponding to the diffraction gratings differ depending on imaging heights of places where the diffraction gratings are positioned.

13. The solid-state imaging device according to claim 12, wherein the positions of the diffraction gratings with respect to the light-receiving surfaces of the photoelectric conversion elements corresponding to the diffraction gratings shift depending on the imaging heights of the places where the diffraction gratings are positioned in a same direction as a direction in which a chief ray of incident light incident on the diffraction gratings is inclined, which is parallel to the light-receiving surfaces.

14. The solid-state imaging device according to claim 11, wherein each of the diffraction gratings is a propagation type surface plasmon resonance filter including a metal film in which a plurality of holes are periodically arranged.

15. The solid-state imaging device according to claim 11, wherein each of the diffraction gratings is a localized surface plasmon resonance filter in which a plurality of metallic columnar structures are periodically arranged.

16. The solid-state imaging device according to claim 11, wherein the plurality of diffraction gratings include a third diffraction grating that selectively transmits light of a first wavelength component and a fourth diffraction grating that selectively transmits light of a second wavelength component different from the first wavelength component.

17. The solid-state imaging device according to claim 16, wherein the light of the first wavelength component is infrared light.

18. An electronic apparatus, comprising:
a solid-state imaging device;
an optical system configured to image incident light on a light-receiving surface of the solid-state imaging device; and
a processor configured to control the solid-state imaging device,
wherein the solid-state imaging device includes:
a pixel array unit in which a plurality of photoelectric conversion elements are arranged in a two-dimensional lattice form;
a plurality of diffraction gratings provided corresponding one-to-one to light-receiving surfaces of the plurality of photoelectric conversion elements; and
a pixel circuit configured to generate a pixel signal on a basis of charge accumulated in each of the photoelectric conversion elements,
wherein a period of a first diffraction grating positioned at a first imaging height is different from a period of a second diffraction grating positioned at a second imaging height different from the first imaging height, and
wherein, when a period of a diffraction grating positioned at a center of the pixel array unit is $S_0$ and a period of a diffraction grating present at a position at which a chief ray of incident light is inclined at an angle $\theta$ is $S_1$, a formula $$S_1 = \left(\frac{1}{1+\sin\theta}\right) \times S_0$$

is satisfied.

19. The electronic apparatus according to claim 18, wherein the processor determines a vegetation state of plants on the basis of image data captured by the solid-state imaging device.

20. The electronic apparatus according to claim 18, wherein the processor executes biometric authentication of a subject on the basis of image data captured by the solid-state imaging device.

* * * * *